US012740450B2

(12) United States Patent
Noguchi et al.

(10) Patent No.: US 12,740,450 B2
(45) Date of Patent: Sep. 15, 2026

(54) PACKAGE SUBSTRATE INCLUDING MEMORY BRIDGE DIE

(71) Applicant: Taiwan Semiconductor Manufacturing Company Limited, Hsinchu (TW)

(72) Inventors: Hiroki Noguchi, Hsinchu City (TW); Yih Wang, Hsinchu City (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 486 days.

(21) Appl. No.: 18/310,557

(22) Filed: May 2, 2023

(65) Prior Publication Data

US 2024/0113030 A1 Apr. 4, 2024

Related U.S. Application Data

(60) Provisional application No. 63/412,845, filed on Oct. 3, 2022.

(51) Int. Cl.
*H10W 70/65* (2026.01)
*H10B 80/00* (2026.01)
(Continued)

(52) U.S. Cl.
CPC ............ *H10W 70/65* (2026.01); *H10B 80/00* (2023.02); *H10W 20/20* (2026.01);
(Continued)

(58) Field of Classification Search
CPC . H01L 2224/16145; H01L 2225/06513; H01L 2225/06517; H01L 2225/06541;
(Continued)

(56) References Cited

U.S. PATENT DOCUMENTS 9,275,955 B2 3/2016 Mahajan et al.
9,432,298 B1 8/2016 Smith
(Continued)

FOREIGN PATENT DOCUMENTS

CN 113871377 A 12/2021
TW 201010038 A 3/2010
(Continued)

OTHER PUBLICATIONS

TW Patent and Trademark Office; Jianq Chyun Intellectual Property Office; TW Application No. 11214145; 3rd Office Action mailed Jun. 30, 2025; 24 pages.
(Continued)

*Primary Examiner* — Telly D Green
(74) *Attorney, Agent, or Firm* — The Marbury Law Group, PLLC

(57) ABSTRACT

A package structure may include a substrate, a plurality of dies on the substrate, and a memory bridge die including a first input/output structure connected to a first semiconductor die of the plurality of dies, and a second input/output structure connected to a second semiconductor die of the plurality of dies. The first semiconductor die may be connected to the second semiconductor die through the memory bridge die.

20 Claims, 23 Drawing Sheets

(51) Int. Cl.

| | |
|---|---|
| ***H10W 20/20*** | (2026.01) |
| ***H10W 70/60*** | (2026.01) |
| ***H10W 70/63*** | (2026.01) |
| ***H10W 70/685*** | (2026.01) |
| ***H10W 74/10*** | (2026.01) |
| ***H10W 90/00*** | (2026.01) |

(52) U.S. Cl.

CPC ........ *H10W 70/611* (2026.01); *H10W 70/635* (2026.01); *H10W 70/685* (2026.01); *H10W 74/117* (2026.01); *H10W 90/00* (2026.01); *H10W 90/701* (2026.01); *H10W 90/722* (2026.01)

(58) Field of Classification Search

CPC ....... H01L 2225/06589; H01L 23/3128; H01L 23/481; H01L 23/49816; H01L 23/5381; H01L 23/5383; H01L 23/5384; H01L 23/5385; H01L 23/5389; H01L 24/16; H01L 25/0652; H01L 25/0655; H01L 25/18; H01L 25/50; H10B 80/00

See application file for complete search history.

(56) References Cited

U.S. PATENT DOCUMENTS

| | | | | |
|---|---|---|---|---|
| 9,443,824 | B1 * | 9/2016 | We | H01L 25/105 |
| 9,666,559 | B2 | 5/2017 | Wang et al. | |
| 9,875,969 | B2 * | 1/2018 | Braunisch | H01L 23/13 |
| 10,720,416 | B2 * | 7/2020 | Chen | H01L 25/105 |
| 10,770,433 | B1 * | 9/2020 | Zhong | H01L 25/0652 |
| 11,217,535 | B2 * | 1/2022 | Elsherbini | H01L 24/19 |
| 11,342,305 | B2 * | 5/2022 | Elsherbini | H01L 23/3675 |
| 11,342,320 | B2 * | 5/2022 | Elsherbini | H01L 24/14 |
| 11,387,177 | B2 * | 7/2022 | Chien | H01L 23/5389 |
| 11,462,461 | B2 * | 10/2022 | Zhang | H01L 23/49833 |
| 11,594,498 | B2 * | 2/2023 | Wu | H01L 23/5385 |
| 11,688,693 | B2 * | 6/2023 | Chen | H01L 21/4857 257/668 |
| 11,756,928 | B2 * | 9/2023 | Chen | H01L 21/568 257/737 |
| 11,894,312 | B2 * | 2/2024 | Chen | H01L 23/5386 |
| 11,916,002 | B2 * | 2/2024 | Kang | H01L 24/08 |
| 12,381,180 | B2 * | 8/2025 | Chen | H01L 21/6835 |
| 2014/0264791 | A1 * | 9/2014 | Manusharow | H01L 25/0655 438/107 |
| 2015/0113195 | A1 * | 4/2015 | Kim | G06F 13/4027 710/308 |
| 2017/0062383 | A1 * | 3/2017 | Yee | H01L 24/20 |
| 2018/0366436 | A1 * | 12/2018 | Wang | H01L 21/566 |
| 2019/0131273 | A1 * | 5/2019 | Chen | H01L 25/16 |
| 2020/0006235 | A1 * | 1/2020 | Aleksov | H01L 25/0652 |
| 2020/0111734 | A1 | 4/2020 | Lin et al. | |
| 2020/0144187 | A1 | 5/2020 | Sikka et al. | |
| 2020/0219815 | A1 * | 7/2020 | Elsherbini | H01L 25/0655 |
| 2020/0294964 | A1 * | 9/2020 | Min | H01L 23/3128 |
| 2020/0395313 | A1 * | 12/2020 | Mallik | H01L 25/0655 |
| 2020/0395335 | A1 * | 12/2020 | Chen | H01L 24/97 |
| 2021/0005542 | A1 * | 1/2021 | Mallik | H01L 25/0652 |
| 2021/0125933 | A1 * | 4/2021 | Chen | H10P 72/74 |
| 2021/0193567 | A1 | 6/2021 | Cheah et al. | |
| 2021/0407962 | A1 * | 12/2021 | Kim | H01L 23/5385 |
| 2022/0093517 | A1 | 3/2022 | Aleksov et al. | |
| 2022/0189880 | A1 | 6/2022 | Pietambaram et al. | |
| 2022/0208233 | A1 | 6/2022 | Lee | |
| 2022/0384308 | A1 * | 12/2022 | Lee | H01L 23/49822 |
| 2023/0065615 | A1 * | 3/2023 | Kung | H01L 23/49827 |

FOREIGN PATENT DOCUMENTS

| | | | |
|---|---|---|---|
| TW | 201712824 | A | 4/2017 |
| TW | 202029449 | A | 8/2020 |
| TW | I777930 | B | 9/2022 |

OTHER PUBLICATIONS

Taiwan Patent & Trademark Office, Jianq Chyun Intellectual Property Office, TW Application No. 112124145; Office Action mailed May 7, 2024; 20 pages.

TW Patent and Trademark Office; Jianq Chyun Intellectual Property Office; TW Application No. 112124145; 4th Office Action mailed Nov. 17, 2025; 30 pages.

TW Patent and Trademark Office; Jianq Chyun Intellectual Property Office; TW Application No. 112124145; 5th Office Action mailed Apr. 27, 2026; 34 pages.

* cited by examiner

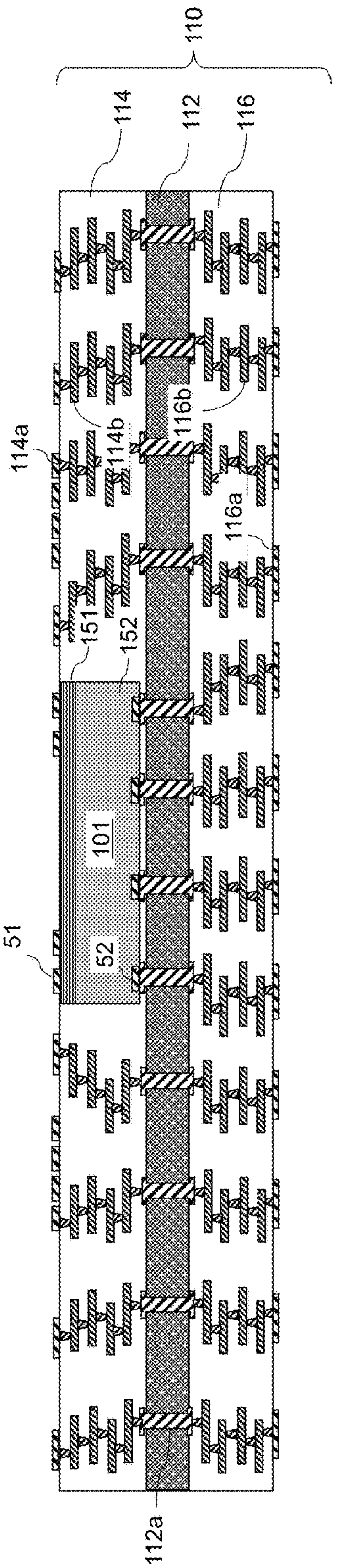
FIG. 2C
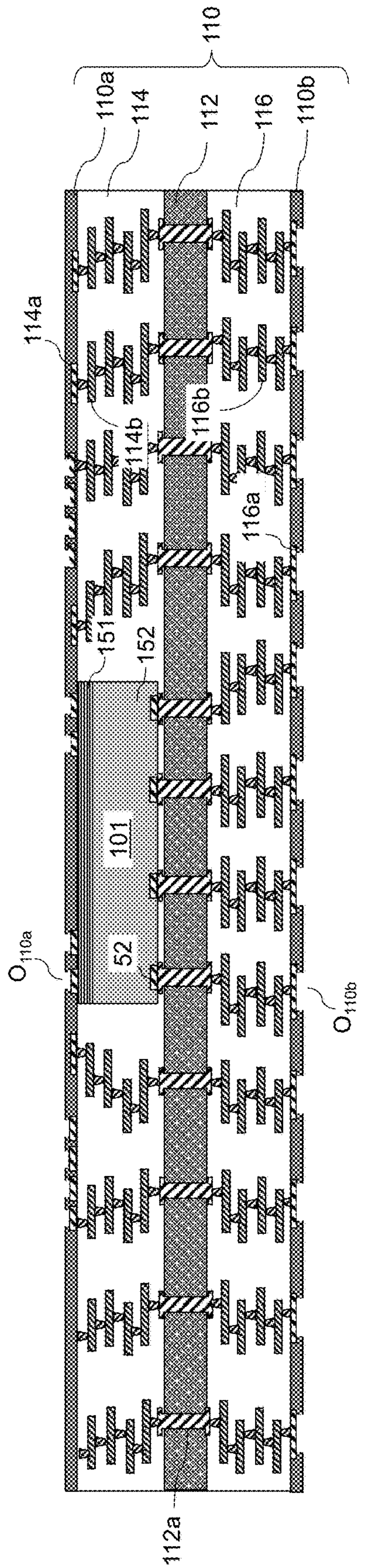
FIG. 2D
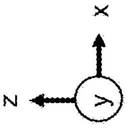
110
114
112
116
114a
114b
116b
116a
151
152
101
51
52
112a
110
110a
114
112
116
110b
114a
114b
116b
116a
151
152
101
52
$O_{110a}$
$O_{110b}$
112a
x
z
y

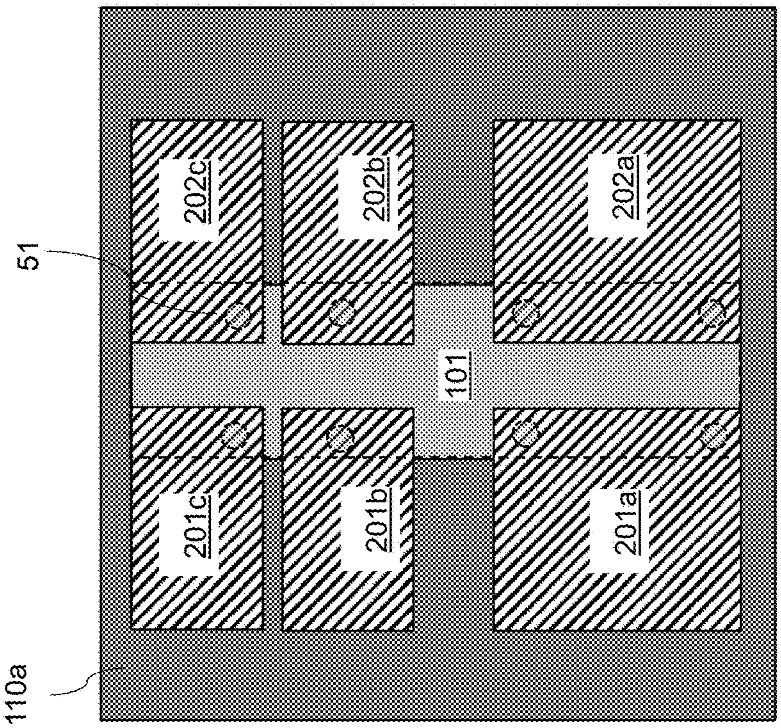
FIG. 4B
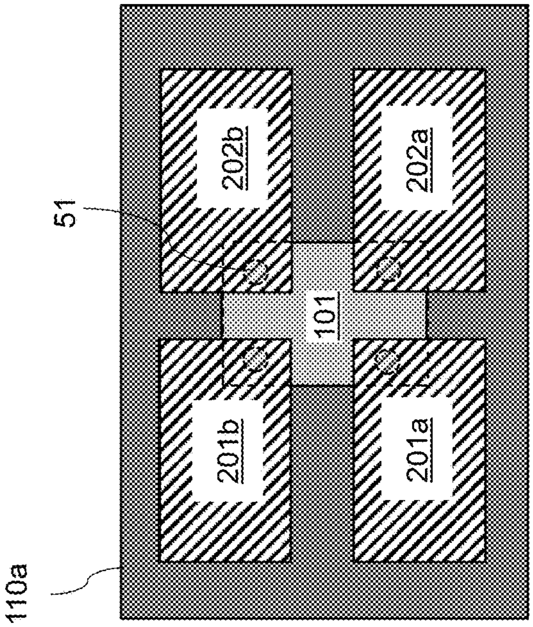
FIG. 4A
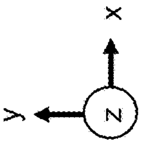

PACKAGE SUBSTRATE INCLUDING MEMORY BRIDGE DIE

RELATED APPLICATIONS

This application claims the benefit of priority from U.S. Provisional Application No. 63/412,845, entitled "A 3D memory integration method with memory bridge techniques," filed on Oct. 3, 2022, the entire contents of which are incorporated herein by reference for all purposes.

BACKGROUND

A typical package structure (e.g., package assembly, organic/silicon interposer package, multi-chip package, integrated circuit (IC) package, semiconductor device, etc.) may connect semiconductor dies using an interconnect structure in a package substrate. However, these package structures may have a poor density of die-package connections and/or a poor density of die-die interconnects. Other package structures may include an interposer (e.g., silicon interposer) that provides sufficient density of die-interposer connections and sufficient density of die-die interconnects. However, the cost of the package structure may be high due to the cost of a large interposer with through-silicon vias.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2C is a vertical cross-sectional view of an intermediate structure including the I/O pads, package substrate upper bonding pads and package substrate lower bonding pads, according to one or more embodiments.

FIG. 2D is a vertical cross-sectional view of an intermediate structure including the package substrate upper surface layer and package substrate lower surface layer, according to one or more embodiments.

FIG. 4A illustrates a plan view of a first alternative layout of the plurality of semiconductor dies in the package structure, according to one or more embodiments.

FIG. 4B illustrates a plan view of a second alternative layout of the plurality of semiconductor dies in the package structure, according to one or more embodiments.

DETAILED DESCRIPTION

Figure 1A:
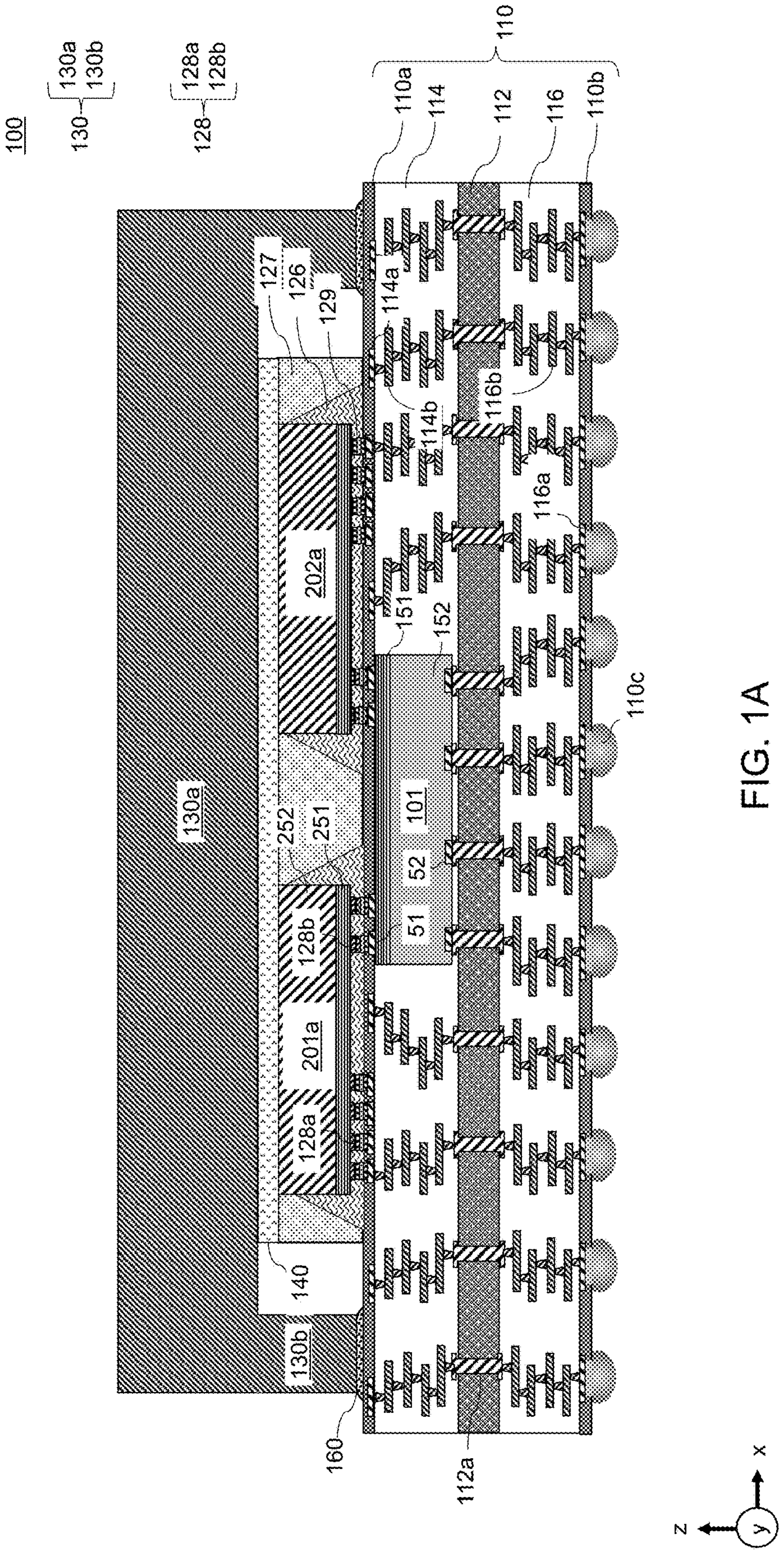
FIG. 1A illustrates a vertical cross-sectional view of the package structure according to one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Some package structures may use a silicon bridge to connect a plurality of semiconductor dies. The silicon bridge may include one or more tiny pieces of silicon with routing layers that may include a redistribution layer structure (RDL structure). The RDL structure may connect one or more semiconductor dies to another one or more semiconductor dies in the package structure. The silicon bridge may be located, for example, in an interposer, on a package substrate, etc. The silicon bridge may serve as an in-package interconnect for multi-die packages, and provide an alternative to a 2.5D package solution. The silicon bridge may be inexpensive and provide sufficient density of die-bridge connections and sufficient density of die-die interconnects.

However, various embodiments disclosed herein may include a package structure implementing a three-dimensional (3D) memory integration method with memory bridge techniques. In at least one embodiment, the package structure may use a memory bridge die (e.g., memory die or memory bridge) as an interconnection bridge to connect a plurality of semiconductor dies. The plurality of semiconductor dies may include multiple stacks (e.g., two or more stacks) of semiconductor dies.

In the case of silicon bridge, the die-to-die communications may become n-to-n (where n is the number of processing elements (PEs) in communication). There may be n x n combinations. However, in various embodiments disclosed herein, by using a memory bridge die, all of the interconnections (also referred to as "routings") may become n-to-1 (where the "1" is the memory bridge die). There may be n×1 interconnections and no need to implement network switches inside the fabric.

In the various embodiments, the plurality of semiconductor dies may include a first semiconductor die and a second semiconductor die. The first semiconductor die and second semiconductor die may include, for example, logic dies (e.g., attached processor (AP) logic dies). The memory bridge die may include an edge input/output (I/O) electrically connected to the first semiconductor die and to the second semiconductor die. The memory bridge die may also function as a shared memory that allows the first semiconductor die and second semiconductor die to freely access data stored in the memory bridge die.

In various embodiments disclosed herein, the memory bridge die may include a new bridge implementation including memory components such as static random access memory (SRAM), magneto-resistive random access memory (MRAM), dynamic random access memory (DRAM), and any other memory solution. Back end of line (BEOL) type memory may be especially suitable for this new bridge implementation included in the various embodiments disclosed herein, since a bridge may include BEOL layers.

The embodiments disclosed herein may have several benefits (e.g., architectural benefits) and advantages over other devices. In particular, the memory bridge die may be connected to multiple semiconductor dies (e.g., the first semiconductor die, the second semiconductor die, etc.) with high speed and high bandwidth physical interconnections. The memory bridge die may be freely accessed by each of the plurality of semiconductor dies (e.g., the first semiconductor die, the second semiconductor die, etc.) through these interconnections. Thus, the memory bridge die may provide a new shared memory solution with high bandwidth at a package level. In addition, since the data stored in the memory bridge die may be accessed directly by each of the plurality of semiconductor dies, the memory bridge die may reduce data transfer distance and save data-moving traffic from die to die (e.g., from the first semiconductor die to the second semiconductor die, etc.). This may greatly improve 3D fabric efficiency.

Since the memory bridge die (memory bridge) may be a separate die from each of the other dies (e.g., logic dies), the process technology of the memory bridge die and logic die may be independent and may be optimized for the memory bridge die and the logic die independently. This may enable fully optimized package integration.

The memory bridge die may include, for example, back-end routing layers and memory components. Any types of memory may be applied to the memory bridge die integration. Further, depending upon the memory technology, the memory bridge die may also include a front end of line (FEOL) device to achieve a read and/or write operation. The plurality of semiconductor dies to be connected by the memory bridge die may include any kind of die and is not limited to a logic die. The memory bridge die may be implemented into a package substrate, a silicon substrate, interposer or a substrate in a 3D integrated die or any other base layer. The substrate may include, for example, glass, ceramic, glass-epoxy, glass polyimide, silicon, single crystal silicon, polysilicon and so on. The substrate may include, for example, metallization including metal lines or layers and metal vias. The metallization may include any type of conductive traces (depending on pitch or dimension).

The package structure may include many different alternative designs. In particular, in some embodiments, the memory bridge die may include through silicon via (TSV) devices. In such embodiments, the memory bridge die may connect a solder ball (e.g., package ball, ball grid array (BGA), etc.) through a substrate layer or interposer layer. Such embodiments may provide an improved power mesh design, since a power supply may be applied from the solder ball to the memory bridge die directly. Furthermore, such embodiments may enable direct memory access between an external main memory to the memory bridge die and provide a high-bandwidth capability.

In at least one embodiment, a substrate or interposer may include other dies (e.g., logic dies) in addition to the memory bridge die. Thus, for example, a logic die may be implemented in a substrate or on an interposer layer adjacent to the memory bridge die. This may further enable more flexible 3D integration.

In at least one embodiment, the memory bridge die may be either have a top side configuration or a bottom side configuration in multi-die integrated structure. As in the bottom-side configuration, in the top-side configuration, a substrate or interposer may include other dies (e.g., logic dies) in addition to the memory bridge die.

In at least one embodiment, the memory bridge die to multi-die connection may have a face to face (F2F) configuration or a face to back (F2B) configuration. In embodiments that use an F2F configuration, the memory bridge die to multi die connection may have higher bandwidth and enable higher performance. In embodiments that use an F2B configuration, the multiple-die structure may have a more stable connection to a solder ball (e.g., package ball) and may enable more stable power rails and a greater external communication bandwidth.

Further, in some embodiments of the package structure in this disclosure, through silicon vias (TSVs) may be unnecessary. Hybrid bonding or microbump bonding without TSVs may be enough for a baseline configuration of the package structure. Of course, for the multiple stack case, TSVs may be used in the package structure of this disclosure.

Figure 1B:
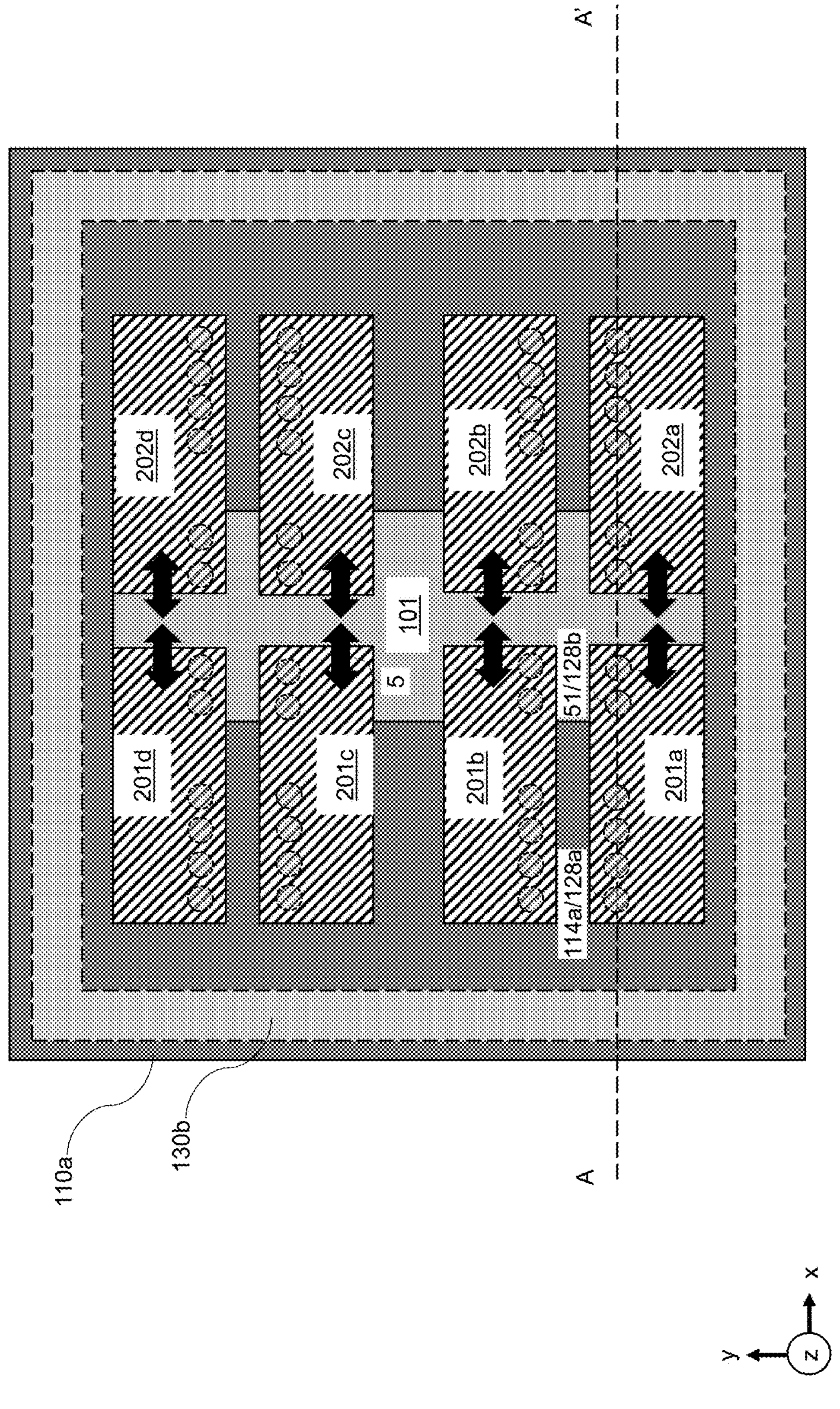
FIG. 1B illustrates a plan view (e.g., top-down view) of the package structure according to one or more embodiments.
Figure 1C:
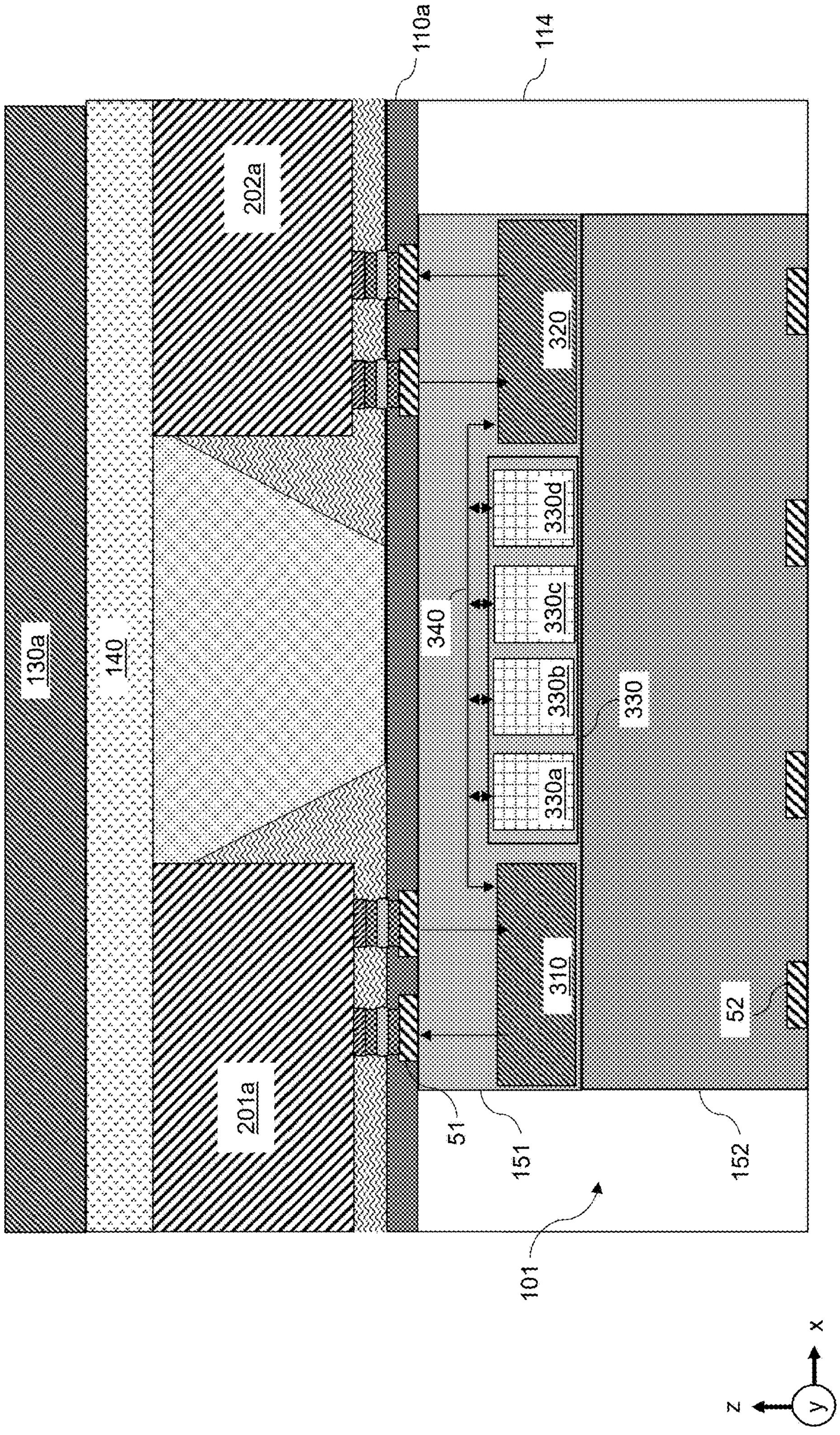
FIG. 1C illustrates a detailed vertical cross-sectional view of the memory bridge die in the package structure according to one or more embodiments.
Figure 1D:
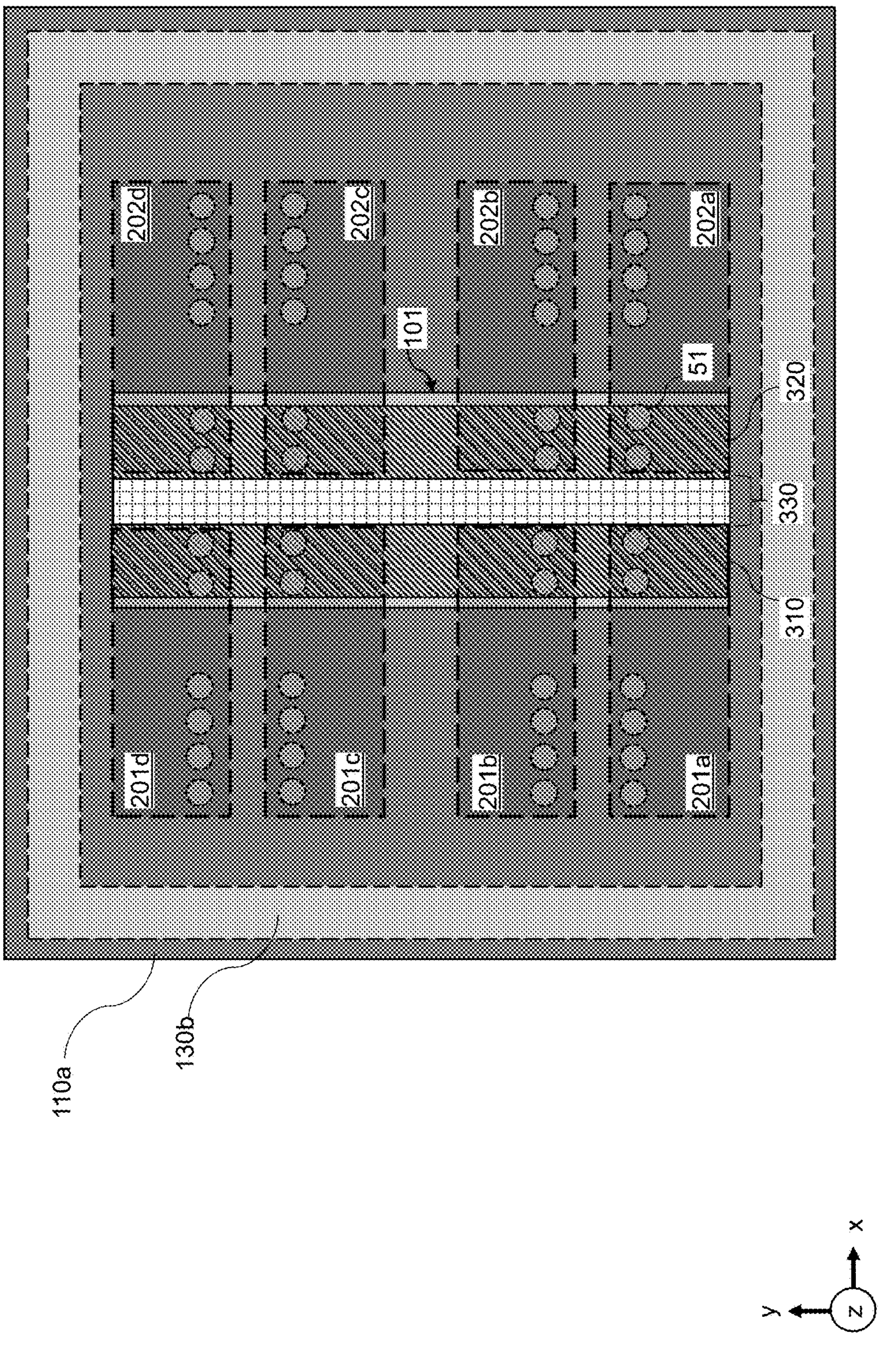
FIG. 1D illustrates a plan view (e.g., top-down view) of the memory bridge die according to one or more embodiments.

FIGS. 1A-1D provide different views of a package structure 100 according to one or more embodiments. FIG. 1A illustrates a vertical cross-sectional view of the package structure 100 according to one or more embodiments. FIG. 1B illustrates a plan view (e.g., top-down view) of the package structure 100 according to one or more embodiments. FIG. 1C illustrates a detailed vertical cross-sectional view of the memory bridge die 101 in the package structure 100 according to one or more embodiments. FIG. 1D illustrates a plan view (e.g., top-down view) of the memory bridge die 101 according to one or more embodiments.

Referring to FIG. 1A, the vertical cross-sectional view in FIG. 1A may be along the line A-A' in FIG. 1B. As illustrated in FIG. 1A, an embodiment package structure 100 may include a package substrate 110 and a plurality of semiconductor dies including a first semiconductor die 201*a* and second semiconductor die 202*a* mounted on the package substrate 110. The plurality of semiconductor dies may also include semiconductor dies 201*b*-201*d* and 202*b*-202*d* (see FIG. 1B) that are not shown in FIG. 1A. The embodiment package structure 100 may also include a package lid 130 on the first semiconductor die 201*a* and second semiconductor die 202*a* and attached to the package substrate 110. The embodiment package structure 100 may also include a thermal interface material (TIM) layer 140 on the first semiconductor die 201*a* and second semiconductor die 202*a*. The embodiment package structure 100 may also include a memory bridge die 101 in the package substrate 110. The memory bridge die 101 may be accessible by the first semiconductor die 201*a* and second semiconductor die 202*a*. That is, the memory bridge die 101 may constitute a shared memory between the first semiconductor dies 201*a*-201*d* and second semiconductor dies 202*a*-202*d*. The memory bridge die 101 may also interconnect the first semiconductor die 201*a* and second semiconductor die 202*a*.

The package substrate 110 may include a core substrate or core-less substrate. The package substrate 110 may include, for example, a core 112, a package substrate upper dielectric layer 114 formed on the core 112 (e.g., a first side or chip-side of the package substrate 110), and a package substrate lower dielectric layer 116 formed on the core 112 (e.g., a second side or board-side of the package substrate 110). In particular, the package substrate 110 may include a build-up film substrate such as an Ajinomoto build-up film (ABF) substrate. That is, in at least one embodiment, each of the package substrate upper dielectric layer 114 and the package substrate lower dielectric layer 116 may be described as an ABF layer.

The core 112 may provide rigidity to the package substrate 110. The core 112 may include, for example, an epoxy resin such as a bismaleimide triazine epoxy (BT epoxy) and/or a woven glass laminate. The core 112 may alternatively or in addition include an organic material such as a polymer material. In particular, the core 112 may include a dielectric polymer material such as polyimide (PI), benzocyclo-butene (BCB), or polybenzobisoxazole (PBO). Other suitable dielectric materials are within the contemplated scope of disclosure.

The core 112 may include one or more through vias 112*a*. The one or more through vias 112*a* may extend from a lower surface of the core 112 to an upper surface of the core 112. The one or more through vias 112*a* may allow an electrical connection between the package substrate upper dielectric layer 114 and the package substrate lower dielectric layer 116. The one or more through vias 112*a* may include, for example, one or more layers and may include metals, metal alloys, and/or or other metal-containing compounds (e.g., Cu, Al, Mo, Co, Ru, W, TiN, TaN, WN, etc.). Other suitable metal materials are within the contemplated scope of disclosure.

The package substrate lower dielectric layer 116 may include a plurality of layers and, in particular, may include a build-up film (e.g., ABF). The package substrate lower dielectric layer 116 may include an organic material such as a polymer material. In particular, the package substrate lower dielectric layer 116 may include one or more layers of dielectric polymer material such as polyimide (PI), benzocyclobutene (BCB), or polybenzobisoxazole (PBO). Other suitable dielectric materials are within the contemplated scope of disclosure.

The package substrate lower dielectric layer 116 may include one or more package substrate lower bonding pads 116*a* on a board-side surface of the package substrate lower dielectric layer 116. In particular, the package substrate lower bonding pads 116*a* may be exposed on the board-side surface of the package substrate lower dielectric layer 116. The package substrate lower dielectric layer 116 may also include one or more metal interconnect structures 116*b*. The metal interconnect structures 116*b* may be connected to the package substrate lower bonding pads 116*a* and the through vias 112*a* in the core 112. The metal interconnect structures 116*b* may include metal layers (e.g., copper traces) and metal vias connecting the metal layers. The package substrate lower bonding pads 116*a* and the metal interconnect structures 116*b* may include, for example, one or more layers and may include metals, metal alloys, and/or or other metal-containing compounds (e.g., Cu, Al, Mo, Co, Ru, W, TiN, TaN, WN, etc.). Other suitable metal materials are within the contemplated scope of disclosure.

A package substrate lower surface layer 110*b* may be formed on the board-side surface of the package substrate lower dielectric layer 116. The package substrate lower surface layer 110*b* may partially cover the package substrate lower bonding pads 116*a*. The package substrate lower surface layer 110*b* may include one or more of a passivation layer and protection layer. The package substrate lower surface layer 110*b* may include, for example, a dielectric polymer material such as polyimide (PI), benzocyclobutene (BCB), or polybenzobisoxazole (PB 0). The package substrate lower surface layer 110*b* may alternatively or additionally include silicon oxide, silicon nitride, low-k dielectric materials such as carbon-doped oxides, extremely low-k dielectric materials such as porous carbon doped silicon dioxide, or a combination thereof. Other suitable dielectric materials are within the contemplated scope of disclosure.

A ball-grid array (BGA) including a plurality of solder balls 110_c_ may be formed on the board-side surface of the package substrate lower dielectric layer 116. The solder balls 110_c_ may allow the package structure 100 to be securely mounted on a substrate such as a printed circuit board (PCB) substrate and electrically coupled to the PCB substrate. The solder balls 110_c_ may contact the package substrate lower bonding pads 116_a_ respectively through openings in the package substrate lower surface layer 110_b_.

The package substrate upper dielectric layer 114 may be formed on an upper surface of the core 112. The package substrate upper dielectric layer 114 may also include a plurality of layers and, in particular, may include a build-up film (e.g., ABF). The package substrate upper dielectric layer 114 may also include an organic material such as a polymer material. In particular, the package substrate upper dielectric layer 114 may include a dielectric polymer material such as polyimide (PI), benzocyclobutene (BCB), or polybenzobisoxazole (PBO). Other suitable dielectric materials are within the contemplated scope of disclosure.

The package substrate upper dielectric layer 114 may include one or more package substrate upper bonding pads 114_a_ on a chip-side surface of the package substrate upper dielectric layer 114. In particular, the package substrate upper bonding pads 114_a_ may be exposed on the chip-side surface of the package substrate upper dielectric layer 114. In at least one embodiment, a bonding pad surface layer (not shown) (e.g., one or more layers of metals (e.g., tin, nickel, palladium, gold, etc.) and/or other materials) may be formed on the package substrate upper bonding pads 114_a_ to improve solder joint reliability.

The package substrate upper dielectric layer 114 may also include one or more metal interconnect structures 114_b_. The metal interconnect structures 114_b_ may include metal layers (e.g., copper traces) and metal vias connecting the metal layers. The package substrate upper bonding pads 114_a_ may be electrically connected to the solder balls 110_c_ of the BGA by way of the metal interconnect structures 114_b_, the through vias 112_a_, the metal interconnect structures 116_b_, and the package substrate lower bonding pads 116_a_. The package substrate upper bonding pads 114_a_ and the metal interconnect structures 114_b_ may include, for example, one or more layers and may include metals, metal alloys, and/or or other metal-containing compounds (e.g., Cu, Al, Mo, Co, Ru, W, TiN, TaN, WN, etc.). Other suitable metal materials are within the contemplated scope of disclosure.

A package substrate upper surface layer 110_a_ may be formed on the chip-side surface of the package substrate upper dielectric layer 114. The package substrate upper surface layer 110_a_ may including a coating layer, laminate layer, etc. The package substrate upper surface layer 110_a_ may be formed so as to at least partially cover the package substrate upper bonding pads 114_a_.

In at least one embodiment, the package substrate upper surface layer 110_a_ may include a solder resist layer (e.g., solder mask layer). The solder resist layer may include a thin layer of polymer material (e.g., epoxy polymer). The solder resist layer may have a thickness in a range from about 5 μm to 50 μm. In at least one embodiment, the solder resist layer may have a thickness in a range from about 10 μm to 30 μm. Greater or lesser thickness of the solder resist layer may be used. The solder resist layer may be formed so as to cover the package substrate upper bonding pads 114_a_ and other metal features (e.g., conductive lines, copper traces) on the chip-side surface of the package substrate 110. The solder resist layer may protect the package substrate upper bonding pads 114_a_ and other metal features from oxidation. The solder resist layer may also inhibit (e.g., prevent) solder bridges (e.g., unintended electrical connections) from forming between closely spaced metal features. The solder resist layer may include solder resist openings (SROs) over the package substrate upper bonding pads 114_a_, respectively. An upper surface of the package substrate upper bonding pads 114_a_ may be exposed through the SROs. The SROs may have a tapered sidewall so that a diameter of the SRO (in the X-Y plane) may decrease in a direction toward the package substrate upper bonding pad 114_a_.

The package substrate upper surface layer 110_a_ may, alternatively or additionally, include a layer other than a solder resist layer, such as a passivation layer or protection layer. In particular, the package substrate upper surface layer 110_a_ may alternatively or additionally include a dielectric polymer material such as polyimide (PI), benzocyclo-butene (BCB), or polybenzobisoxazole (PBO), silicon oxide, silicon nitride, low-k dielectric materials such as carbon-doped oxides, extremely low-k dielectric materials such as porous carbon doped silicon dioxide, a combination thereof or other suitable material.

The memory bridge die 101 may be formed in the package substrate upper dielectric layer 114. An upper surface of the memory bridge die 101 may be substantially coplanar with an upper surface of the package substrate upper dielectric layer 114. The memory bridge die 101 may include, for example, static random access memory (SRAM), magnetoresistive random access memory (MRAM), dynamic random access memory (DRAM), high bandwidth memory (HBM), back end of line (BEOL) type memory and/or any other suitable memory device. In particular, the memory bridge die 101 may include a silicon or silicon dioxide based memory die including one or more memory arrays, peripheral circuits, input/output circuits, metal bumps, front end of line (FEOL) devices and BEOL devices.

The memory bridge die 101 may include, for example, an active region 151. The active region 151 may include a front end of line (FEOL) region including electronic circuitry including various electronic devices (e.g., transistors, resistors, etc.). In particular, the FEOL region may include one or more memory circuits including memory devices (e.g., volatile memory (VM) devices and/or non-volatile memory (NVM) devices). The active region 151 may also include a back end of line (BEOL) region that may include interlayer dielectric having a plurality of dielectric layers. The dielectric layers may include, for example, $SiO_2$, a dielectric polymer or other suitable dielectric material. The interlayer dielectric may include one or more metal interconnect structures (metallization layers) formed therein. The metal interconnect structures may include metal traces and metal vias formed in the dielectric layers and provide an electrical connection to the electronic circuitry in the FEOL region.

The memory bridge die 101 may also include one or more input/output (I/O) pads 51 electrically coupled to the active region 151. The I/O pads 51 may serve as an input and/or output (e.g., edge I/O) for the memory bridge die 101. The I/O pads 51 may allow each of the first semiconductor die 201_a_ and second semiconductor die 202_a_ to access the memory bridge die 101. The I/O pads 51 may constitute simple die-to-die interconnects providing a high speed and high bandwidth physical interconnection between the memory bridge die 101 and the first semiconductor die 201_a_ and second semiconductor die 202_a_. Thus, the memory bridge die 101 may provide a new shared memory solution with high bandwidth in package level. In particular, the I/O pads 51 may allow the package structure 100 to provide higher bandwidth connections than typical package structures.

The memory bridge die 101 may also include a bulk semiconductor region 152 (e.g., bulk silicon region) on the active region 151. The memory bridge die 101 may also include optional bottom bonding pads 52 on a bottom surface of the bulk semiconductor region 152. The optional bottom bonding pads 52 may contact the through vias 112*a* in the core 112 of the package substrate 110. The memory bridge die 101 may be electrically connected to the solder balls 110*c* (e.g., BGA) through the optional bottom bonding pads 52. In at least one embodiment, the memory bridge die 101 may omit the optional bottom bonding pads 52.

A side of the first memory bridge die 101 that includes the bulk semiconductor region 152 may be referred to as a "back side" of the memory bridge die 101. A side of the memory bridge die 101 that includes the active region 151 may be referred to as a "front side" of the memory bridge die 101. The front side of the memory bridge die 101 may also be referred to as the "face side."

The first semiconductor die 201*a* and second semiconductor die 202*a* may be mounted on the package substrate upper dielectric layer 114. The first semiconductor die 201*a* and second semiconductor die 202*a* may be bonded to the package substrate upper bonding pads 114*a*. The first semiconductor die 201*a* and second semiconductor die 202*a* may be electrically connected to the package substrate 110 through the package substrate upper bonding pads 114*a*.

The first semiconductor die 201*a* and second semiconductor die 202*a* may also be mounted on the memory bridge die 101. In particular, each of the first semiconductor die 201*a* and second semiconductor die 202*a* may straddle an outermost sidewall (e.g., in the x-direction) of the memory bridge die 101. The first semiconductor die 201*a* and second semiconductor die 202*a* may be bonded to I/O pads 51 on the active region 151 of the memory bridge die 101. The first semiconductor die 201*a* and second semiconductor die 202*a* may be electrically connected to the memory bridge die 101 by the I/O pads 51. The first semiconductor die 201*a* and second semiconductor die 202*a* may store data to the memory bridge die 101 via the I/O pads 51. The first semiconductor die 201*a* and second semiconductor die 202*a* may also retrieve data from the memory bridge die 101 via the I/O pads 51. The I/O pads 51 may also allow the first semiconductor die 201*a* to be interconnected with the second semiconductor die 202*a*. That is, the first semiconductor die 201*a* may be interconnected with the second semiconductor die 202*a* through the I/O pads 51.

The first semiconductor die 201*a* and second semiconductor die 202*a* may be bonded to the package substrate 110 (e.g., to the package substrate upper bonding pads 114*a*) by one or more first microbumps 128*a* (e.g., interconnect structures) using solder arrays 129. The first semiconductor die 201*a* and second semiconductor die 202*a* may be bonded to memory bridge die 101 (e.g., to the I/O pads 51) by one or more second microbumps 128*b* (e.g., interconnect structures) using additional solder arrays 129. Alternatively, the first semiconductor die 201*a* and second semiconductor die 202*a* may be bonded to the package substrate 110 and the memory bridge die 101 by a hybrid bond (i.e., a direct bond that may include a dielectric-to-dielectric bond, a polymer-to-polymer bond, and/or a metal-to-metal bond). In particular, the first semiconductor die 201*a* and second semiconductor die 202*a* may be bonded to the package substrate upper bonding pads 114*a* and I/O pads 51 by a hybrid bond.

Each of the first semiconductor die 201*a* and second semiconductor die 202*a* (e.g., the plurality of semiconductor dies) may include a processing element (PE) such as a logic die. The logic die may include, for example, an attached processor (AP) logic die. The logic dies may include an additional central processing unit (CPU) connected to a primary CPU in a multiprocessing environment. The logic dies may serve as an extension of a primary CPU and may share the system software and peripheral devices. Each of the logic dies may be preferably functionally equivalent to each of the other logic dies. The logic dies may each include a load/store unit and logic suitable for performing a mathematical function.

The first semiconductor die 201*a* and second semiconductor die 202*a* (e.g., the plurality of semiconductor dies) may alternatively or additionally include a mobile application processor, microcontroller, etc.), a semiconductor chip or chiplet for a high performance computing (HPC) application, an artificial intelligence (AI) application, and a 5G cellular network application, or a central processing unit (CPU) chip, graphics processing unit (GPU) chip, field-programmable gate array (FPGA) chip, networking chip, application-specific integrated circuit (ASIC) chip, artificial intelligence/deep neural network (AI/DNN) accelerator chip, etc., a co-processor, accelerator, a high data rate transceiver die, a I/O interface die, a IPD die (e.g., integrated passives device), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) die), a monolithic 3D heterogeneous chiplet stacking die, etc.

Each of the first semiconductor die 201*a* and second semiconductor die 202*a* may include, for example, a semiconductor die active region 251. The semiconductor die active region 251 may include a front end of line (FEOL) region including electronic circuitry including various electronic devices (e.g., transistors, resistors, etc.). In particular, the FEOL region may include one or more logic circuits including logic devices (e.g., logic gates) and/or one or more memory circuits including memory devices (e.g., volatile memory (VM) devices and/or non-volatile memory (NVM) devices). The semiconductor die active region 251 may also include a back end of line (BEOL) region that may include interlayer dielectric having a plurality of dielectric layers. The dielectric layers may include, for example, $SiO_2$, a dielectric polymer or other suitable dielectric material. The interlayer dielectric may include one or more metal interconnect structures (metallization layers) formed therein. The metal interconnect structures may include metal traces and metal vias formed in the dielectric layers and provide an electrical connection to the electronic circuitry in the FEOL region.

Each of the first semiconductor die 201*a* and second semiconductor die 202*a* may also include a bulk semiconductor region 252 (e.g., bulk silicon region) on the semiconductor die active region 251. A side of the first semiconductor die 201*a* and second semiconductor die 202*a* that includes the bulk semiconductor region 252 may be referred to as the "back side." A side of the first semiconductor die 201*a* and second semiconductor die 202*a* that includes the semiconductor die active region 251 may be referred to as the "front side." The front side of the semiconductor die 201*a*, 202*a* may also be referred to as the "face side" of the semiconductor die 201*a*, 202*a*.

As illustrated in FIG. 1A, the first semiconductor die 201*a* and second semiconductor die 202*a* may be arranged so that the face side of the first semiconductor die 201*a* and the face side of the second semiconductor die 202*a* are adjacent to the face side of the memory bridge die 101. Thus, each of the first semiconductor die 201*a* and second semiconductor die 202*a* may be said to have a face-to-face (F2F) arrangement with the memory bridge die 101. Alternatively or additionally, the memory bridge die 101 may have a face to back (F2B) orientation with respect to the first semiconductor dies 201*a*-201*d* and second semiconductor dies 202*a*-202*d*.

A package underfill layer 126 may be formed around the microbumps 128 and between the first semiconductor die 201*a* and the package substrate 110 (including the memory bridge die 101) and between the second semiconductor die 202*a* and the package substrate 110. The package underfill layer 126 may be formed as separate portions under each of the first semiconductor die 201*a* and second semiconductor die 202*a* as illustrated in FIG. 1A. The package underfill layer 126 may alternatively be formed continuously under both of the first semiconductor die 201*a* and second semiconductor die 202*a*. The package underfill layer 126 may also be formed between first semiconductor die 201*a* and the second semiconductor die 202*a*. The package underfill layer 126 may be formed of an epoxy-based polymeric material.

A molding material layer 127 may be formed over the first semiconductor die 201*a*, second semiconductor die 202*a*, the package underfill layer 126 and the package substrate 110. The molding material layer 127 may be formed of an epoxy molding compound (EMC).

The TIM layer 140 may include, for example, a gel TIM, graphite TIM, metal TIM, solder TIM and a carbon nanotube TIM. Other types of TIMs are within the contemplated scope of this disclosure. In at least one embodiment, the TIM layer 140 may be in a range from 30 μm to 150 μm. The TIM layer 140 may be formed on the first semiconductor die 201*a* and the second semiconductor die 202*a* to dissipate of heat generated during operation of the package structure 100 (e.g., operation of first semiconductor die 201*a* and second semiconductor die 202*a*). The TIM layer 140 may be attached to the first semiconductor die 201*a* and second semiconductor die 202*a*, for example, by a thermally conductive adhesive. In particular, the TIM layer 140 may contact an upper surface of first semiconductor die 201*a*, an upper surface of second semiconductor die 202*a*, an upper surface of the molding material layer 127 and/or an upper surface of the package underfill layer 126. The TIM layer 140 may have a low bulk thermal impedance and high thermal conductivity. The bond-line-thickness (BLT) (e.g., a distance between the package lid 130 and the interposer module 120) may be less than about 100 μm, although greater or lesser distances may be used.

The package lid 130 may be mounted on the package substrate 110 and contact the TIM layer 140. The package lid 130 may be formed of a metal such as copper with a nickel coating, or an aluminum alloy. The package lid 130 may alternatively be formed of a ceramic material or hard plastic (polymer) material. Other suitable package lid materials are within the contemplated scope of disclosure. The package lid 130 may help to provide rigidity to the package substrate 110.

The package lid 130 may include a package lid plate portion 130*a* and a package lid foot portion 130*b*. The package lid foot portion 130*b* may be fixed to the package substrate 110 by an adhesive 160 such as a silicone adhesive or an epoxy adhesive. Other adhesives are within the contemplated scope of this disclosure. The package lid foot portion 130*b* may be formed on the package substrate 110 so as to surround (e.g., laterally surround; encircle) the first semiconductor die 201*a* and the second semiconductor die 202*a* in the x-y plane. The package lid foot portion 130*b* may extend in a substantially perpendicular direction (e.g., in the z-direction) from the package substrate 110.

The package lid plate portion 130*a* may be integrally formed (e.g., formed as a unit) with the package lid foot portion 130*b*. The package lid plate portion 130*a* may cover the first semiconductor die 201*a* and the second semiconductor die 202*a*. The package lid plate portion 130*a* may contact at least a portion of the TIM layer 140. In one or more embodiments, the package lid plate portion 130*a* may directly contact an entire upper surface of the TIM layer 140. The package lid plate portion 130*a* may have a plate shape (e.g., planar shape) and be substantially parallel to an upper surface of the package substrate 110. The package lid plate portion 130*a* may extend, for example, in an x-y plane in FIG. 1A. The package lid plate portion 130*a* may include a central portion that is substantially aligned in the z-direction with a central portion of the package substrate 110 and a central portion of the memory bridge die 101.

Referring to FIG. 1B, elements of the package structure 100 (e.g., the package lid plate portion 130*a*, the package underfill layer 126, the molding material layer 127 and TIM layer 140) have been omitted for ease of explanation. It should be noted that although FIG. 1B depicts eight semiconductor dies (e.g., first semiconductor dies 201*a*-201*d* and the second semiconductor dies 202*a*-202*d*) and one memory bridge die 101, the package structure 100 may include any number of semiconductor dies and memory bridge dies. The package structure 100 may also include any number of vertical levels (e.g., stacked in the z-direction) of semiconductor dies and any number of vertical levels (e.g., stacked in the z-direction) of memory bridge dies 101.

Bi-directional arrows 5 are included in FIG. 1B to indicate a bi-directional flow of data between the memory bridge die 101 and each of the first semiconductor dies 201*a*-201*d* and the second semiconductor dies 202*a*-202*d*. A location of the package lid foot portion 130*b* on the package substrate upper surface layer 110*a* is shown in FIG. 1B by highlighting and dashed lines. As illustrated in FIG. 1B, the package lid foot portion 130*b* may contact the package substrate upper surface layer 110*a* around an entirety of the first semiconductor dies 201*a*-201*d* and the second semiconductor dies 202*a*-202*d*. The package lid foot portion 130*b* may also be formed around an entire periphery of the memory bridge die 101 in the plan view. A location of the underlying package substrate upper bonding pads 114*a* and first microbumps 128*a* is shown in FIG. 1B by highlighting and dashed lines. A location of the underlying I/O pads 51 and the second microbumps 128*b* is also shown in FIG. 1B by highlighting and dashed lines.

As illustrated in FIG. 1B, the first semiconductor dies 201*a*-201*d* and the second semiconductor dies 202*a*-202*d* may extend longitudinally in the x-direction. The memory bridge die 101 may extend longitudinally in the y-direction. The first semiconductor dies 201*a*-201*d* and the second semiconductor dies 202*a*-202*d* may be arranged perpendicular to the outermost sidewall of the memory bridge die 101. The first semiconductor dies 201*a*-201*d* and the second semiconductor dies 202*a*-202*d* may be spaced apart in the y-direction substantially uniformly along the length of the memory bridge die 101.

The first semiconductor dies 201*a*-201*d* and second semiconductor dies 202*a*-202*d* may have a substantially uniform length in the x-direction and width in the y-direction. A portion of the length (in the x-direction) of the first semiconductor dies 201*a*-201*d* and the second semiconductor dies 202*a*-202*d* located over the memory bridge die 101 may be less than a portion of the length (in the x-direction) of the first semiconductor dies 201*a*-201*d* and the second semiconductor dies 202*a*-202*d* located over the package substrate upper surface layer 110*a*. In at least one embodiment, the portion of the length (in the x-direction) of the first semiconductor dies 201*a*-201*d* and the second semiconductor dies 202*a*-202*d* located over the memory bridge die 101 may be less than 30% of the portion of the length (in the x-direction) of the first semiconductor dies 201*a*-201*d* and the second semiconductor dies 202*a*-202*d* located over the package substrate upper surface layer 110*a*. In at least one embodiment, a width of the memory bridge die 101 in the x-direction is at least 60% of the length of the first semiconductor dies 201*a*-201*d* and the second semiconductor dies 202*a*-202*d* in the x-direction.

With the configuration in FIG. 1B, the data stored in the memory bridge die 101 may be accessed directly by the first semiconductor die 201*a* and second semiconductor die 202*a*. As a result, the memory bridge die 101 may reduce data transfer distance from die to die which may greatly improve 3D fabric efficiency, compared to other package structure. Since the memory bridge die 101 is separate from the first semiconductor die 201*a* and second semiconductor die 202*a*, the process technologies for the memory bridge die 101 and the first semiconductor die 201*a* and second semiconductor die 202*a*, may be independent and optimized for memory and logic devices independently. This may enable fully optimized package integration.

Referring to FIG. 1C, the memory bridge die 101 is illustrated as embedded in the package substrate upper dielectric layer 114 of a package substrate 110. However, the memory bridge die 101 may be embedded in or mounted on any suitable substrate such as a semiconductor or organic interposer (e.g., silicon interposer). The memory bridge die 101 may be embedded in or mounted on other suitable substrates including, for example, glass, ceramic, glass-epoxy, glass polyimide, silicon, single crystal silicon, or poly-silicon substrates.

The memory bridge die 101 may include an I/O pad 51 dedicated to inputting data to the memory bridge die 101, and a second I/O pad 51 dedicated to outputting data from the memory bridge die 101. The active region 151 of the memory bridge die 101 may include a first memory circuit section 310 connected to the first semiconductor die 201*a* through the I/O pads 51. The first memory circuit section 310 may include, for example, a memory controller, a memory interface and/or a physical layer (PHY) circuit. The active region 151 of the memory bridge die 101 may also include a second memory circuit section 320 connected to the second semiconductor die 202*a* through the I/O pads 51. The second memory circuit section 320 may also include a memory controller, a memory interface and/or a physical layer (PHY) circuit.

The memory bridge die 101 may further include a memory array section 330 between the first memory circuit section 310 and the second memory circuit section 320. The memory array section 330 may include one or more memory arrays 330*a*-330*d*. Each of the memory arrays 330*a*-330*d* may include a plurality of memory cells formed in rows and columns of an array. Each of the memory arrays 330*a*-330*d* may have a data storage capacity of one or more gigabytes.

The memory bridge die 101 may further include a data line 340. The data line 340 may include, for example, a high bandwidth data line. The data line 340 may be used to transfer data between the first memory circuit section 310 and the second memory circuit section 320. The memory arrays 330*a*-330*d* may also be connected (e.g., individually connected) to the data line 340. The first semiconductor die 201*a* may, therefore, access data stored in the memory arrays 330*a*-330*d* via first memory circuit section 310 and retrieve data stored in the memory arrays 330*a*-330*d* via the first memory circuit section 310. The second semiconductor die 202*a* may also access data stored in the memory arrays 330*a*-330*d* via the second memory circuit section 320 and retrieve data stored in the memory arrays 330*a*-330*d* via the second memory circuit section 320.

Referring to FIG. 1D, each of the first memory circuit section 310, second memory circuit section 320 and memory array section 330 may extend longitudinally in the y-direction between the first semiconductor dies 201*a*-201*d* and the second semiconductor die 202*a*-202*d*. The length of each of the first memory circuit section 310, second memory circuit section 320 and memory array section 330 in the y-direction may be at least equal to a combined width of the first semiconductor dies 201*a*-201*d* (or a combined width of the second semiconductor dies 202*a*-202*d*) in the y-direction. The first semiconductor dies 201*a*-201*d* may partially overlap the first memory circuit section 310, and the I/O pads 51 may be located over the first memory circuit section 310. The second semiconductor dies 202*a*-202*d* may partially overlap the second memory circuit section 320, and the I/O pads 51 may be located over the second memory circuit section 320.

Alternatively, each lateral pair of the first semiconductor dies 201*a*-201*d* and second semiconductor dies 202*a*-202*d* (e.g., lateral pair 201*a*/202*a*, lateral pair 201*b*/202*b*, and so on) may have a dedicated first memory circuit section 310, second memory circuit section 320 and memory array section 330. In that case, the memory bridge die 101 may include one first memory circuit section 310, one second memory circuit section 320 and one memory array section 330 for every lateral pair of the first semiconductor dies 201*a*-201*d* and second semiconductor dies 202*a*-202*d* connected to the memory bridge die 101.

Figure 2A:
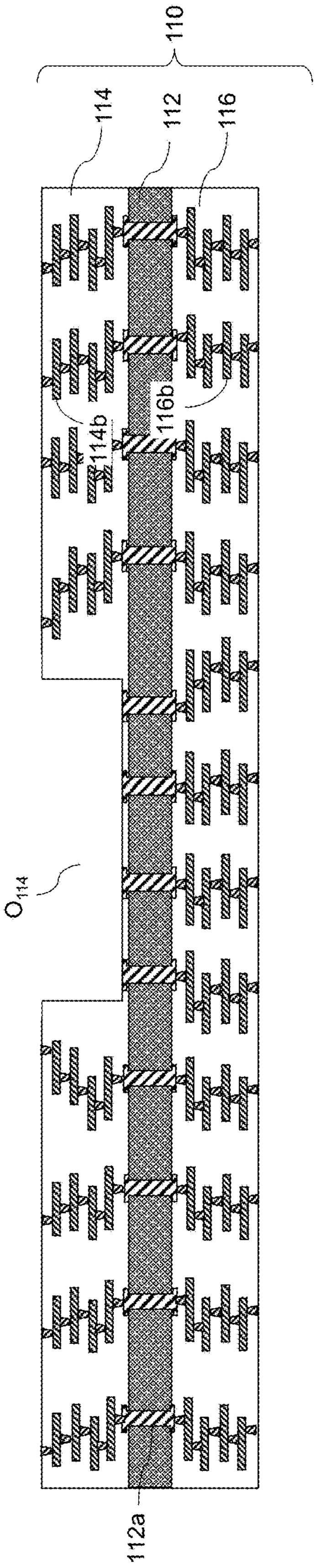
FIG. 2A is a vertical cross-sectional view of an intermediate structure including the package substrate having an opening, according to one or more embodiments.

FIGS. 2A-2J illustrate a method of forming the package structure 100 according to one or more embodiments. FIG. 2A is a vertical cross-sectional view of an intermediate structure including the package substrate 110 having an opening O114, according to one or more embodiments. The package substrate 110 including the core 112, the package substrate upper dielectric layer 114, and the package substrate lower dielectric layer 116 may be provided. An opening $O_{114}$ may be formed in the package substrate upper dielectric layer 114 of the package substrate 110. The opening $O_{114}$ may have a shape substantially corresponding to a shape of the memory bridge die 101. The opening $O_{114}$ may have a length in the y-direction and width in the x-direction substantially the same as a length and width of the memory bridge die 101, respectively. In at least one embodiment, the length of the opening $O_{114}$ may be in a range from 5% to 20% greater than the length of the memory bridge die 101, and the width of the opening $O_{114}$ may be in a range from 5% to 20% greater than the width of the memory bridge die 101.

The openings $O_{114}$ may be formed in the package substrate upper dielectric layer 114 so as to expose an upper surface of the through vias 112*a* in the core 112. The opening $O_{114}$ may be formed, for example, by using a photolithographic process. The photolithographic process (e.g., processes) used to form the opening $O_{114}$ may include forming a patterned photoresist mask (not shown) on the package substrate upper dielectric layer 114, and etching (e.g., wet etching, dry etching, etc.) the exposed upper surface of the package substrate upper dielectric layer 114 through an opening in the photoresist mask. The photoresist mask may be subsequently removed by ashing, dissolving the photoresist mask or by consuming the photoresist mask during the etch process.

Figure 2B:
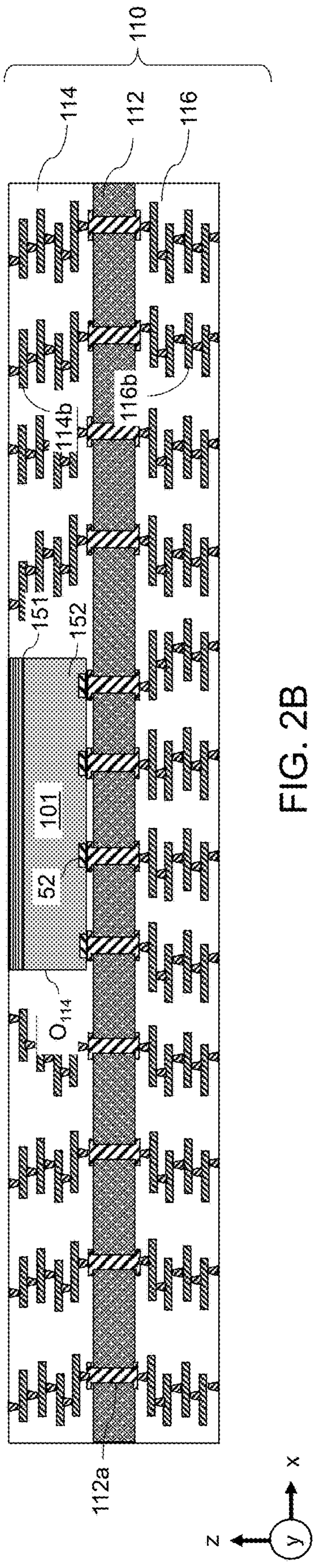
FIG. 2B is a vertical cross-sectional view of an intermediate structure including the memory bridge die in the opening, according to one or more embodiments.

FIG. 2B is a vertical cross-sectional view of an intermediate structure including the memory bridge die 101 in the opening $O_{114}$, according to one or more embodiments. As illustrated in FIG. 2B, the memory bridge die 101 may be placed in the opening $O_{114}$ so that an upper surface of the memory bridge die 101 is substantially coplanar with the upper surface of the package substrate upper dielectric layer 114. The memory bridge die 101 may be placed in the opening $O_{114}$, for example, by using a electromechanical pick-and-place (PNP) machine. In addition, the memory bridge die 101 should be seated on a bottom of the opening $O_{114}$ so that the optional bottom bonding pads 52 make good contact with the upper surface of the through vias 112*a*.

The memory bridge die 101 may be securely fixed in the opening $O_{114}$ by a suitable bonding method. The method used to bond the memory bridge die 101 in the opening $O_{114}$ may depend, for example, on the surface flatness, smoothness, and cleanliness after chemical mechanical polishing (CMP), bonding material and bonding environment. For example, hybrid bonding or direct bonding (e.g., Cu-to-Cu), reactive bonding (e.g., Au-to-Au), surface activated bonding, plasma activated bonding and so on may be used.

Alternatively, the memory bridge die 101 may be first mounted on the core 112 of the package substrate 110, and then the package substrate upper dielectric layer 114 may be built up around the memory bridge die 101 (e.g., a substrate-last process) The process order may be re-ordered to align with a packaging requirement for the package structure 100. That is, both processes (the substrate-first process and the substrate-last process as illustrated in FIGS. 2A-2B) may be suitable.

As another alternative, in place of the package substrate 110, a substrate including a metallic line therein may be used. In that case, a thickness of the substrate may be reduced by a planarization process such as chemical mechanical planarization (CMP) to expose the metallic line in the substrate. The memory bridge die 101 may then be mounted on the substrate so that the optional bottom bonding pads 52 contact the metallic line in the substrate. The substrate may then be reconstructed (built up) around the memory bridge die 101.

FIG. 2C is a vertical cross-sectional view of an intermediate structure including the I/O pads 51, package substrate upper bonding pads 114*a* and package substrate lower bonding pads 116*a*, according to one or more embodiments.

The I/O pads 51 may be formed, for example, on the upper surface of the active region 151 of the memory bridge die 101. The I/O pads 51 may be formed so as to contact, for example, metal interconnect structures (not shown) in the active region 151. The I/O pads 51 may be formed by depositing a metal layer (e.g., copper, aluminum or other suitable conductive materials) on the upper surface of the active region 151. The metal layer may then be patterned by etching (e.g., by wet etching, dry etching, etc.) so as to form the I/O pads 51. Other suitable metal layer materials and etching processes may be within the contemplated scope of disclosure. It should be noted that the I/O pads 51 may alternatively be formed on the active region 151 at the time the memory bridge die 101 is placed (e.g., embedded) in the package substrate 110.

The package substrate upper bonding pads 114*a* may be formed, for example, on an uppermost dielectric layer of the package substrate upper dielectric layer 114. The package substrate upper bonding pads 114*a* may be formed so as to contact the metal interconnect structures 114*b*. The package substrate upper bonding pads 114*a* may be located on package substrate upper dielectric layer 114 in order to provide an interconnection with the first semiconductor die 201*a* and the second semiconductor die 202*a*. The package substrate upper bonding pads 114*a* may be formed in a manner similar to the manner of forming the I/O pads 51 (e.g., depositing a metal layer, patterning the metal layer by etching, etc.).

The package substrate lower bonding pads 116*a* may be formed, for example, on a lowest dielectric layer of the package substrate lower dielectric layer 116. The package substrate lower bonding pads 116*a* may be formed so as to contact the metal interconnect structures 116*b*. The package substrate lower bonding pads 116*a* may also be formed in a manner similar to the manner of forming the I/O pads 51 (e.g., depositing a metal layer, patterning the metal layer by etching, etc.).

After formation, the I/O pads 51, package substrate upper bonding pads 114*a* and package substrate lower bonding pads 116*a* may optionally undergo a surface roughening treatment (e.g., CZ treatment). In the surface roughening treatment, a surface of the package substrate upper bonding pads 114*a* (e.g., a copper surface) and surface of the package substrate lower bonding pads 116*a* (e.g., a copper surface) may be etched by an organic acid-type micro-etching solution, to create a super-roughened surface (e.g., copper surface). The uniquely-roughened copper surface topography of the I/O pads 51, package substrate upper bonding pads 114*a* and package substrate lower bonding pads 116*a* may help to achieve a high copper-to-resin adhesion.

FIG. 2D is a vertical cross-sectional view of an intermediate structure including the package substrate upper surface layer 110*a* and package substrate lower surface layer 110*b*, according to one or more embodiments. In at least one embodiment, the package substrate upper surface layer 110*a* may include a solder resist layer (e.g., polymer material), also referred to as a solder mask. The package substrate upper surface layer 110*a* may also be referred to as the upper solder resist layer 110*a*, and the package substrate lower surface layer 110*b* may also be referred to as the lower solder resist layer 110*b*.

The package substrate upper surface layer 110*a* and package substrate lower surface layer 110*b* may be applied concurrently. The package substrate upper surface layer 110*a* and package substrate lower surface layer 110*b* may be applied, for example, as a liquid photo-imageable film. The liquid photo-imageable film may be applied, for example, by silk-screening or spraying the liquid photo-imageable film onto the surface of the package substrate 110. The liquid photo-imageable film may be applied over the I/O pads 51, package substrate upper bonding pads 114*a* and the package substrate lower bonding pads 116*a*. The package substrate upper surface layer 110*a* and package substrate lower surface layer 110*b* may alternatively be applied as a dry-film photo-imageable film that may be vacuum-laminated onto the surface of the package substrate 110 and over the I/O pads and package substrate upper bonding pads 114*a*, and the package substrate lower bonding pads 116*a*, respectively. The I/O pads 51, package substrate upper surface layer 110*a* and package substrate lower surface layer 110*b* may alternatively or additionally be formed, for example, by chemical vapor deposition (CVD), physical vapor deposition (PVD), spin coating, lamination or other suitable deposition technique.

The package substrate upper surface layer 110*a* and package substrate lower surface layer 110*b* may be applied so as to have a thickness that is slightly greater than a thickness of the I/O pads and package substrate upper bonding pads 114*a*, and the package substrate lower bonding pads 116*a*, respectively. Alternatively, the package substrate upper surface layer 110*a* and package substrate lower surface layer 110*b* may be applied so as to have an upper surface that is substantially co-planar with an upper surface of the I/O pads 51 and package substrate upper bonding pads 114*a*, and the package substrate lower bonding pads 116*a*, respectively.

Openings $O_{110a}$ may be then be formed in the package substrate upper surface layer 110*a* so as to expose an upper surface of the I/O pads 51 and an upper surface of the package substrate upper bonding pads 114*a*. Openings $O_{110b}$ may be formed in the package substrate lower surface layer 110*b* so as to expose an upper surface of the package substrate lower bonding pads 116*a*. The openings $O_{110a}$ and the openings $O_{110b}$ may be formed, for example, by using a photolithographic process. In at least one embodiment, the openings $O_{110a}$ and the openings $O_{110b}$ may be formed in separate photolithographic processes.

The photolithographic process (e.g., processes) used to form the openings $O_{110a}$ may include forming a patterned photoresist mask (not shown) on the package substrate upper surface layer 110*a*, and etching (e.g., wet etching, dry etching, etc.) the exposed upper surface of the package substrate upper surface layer 110*a* through openings in the photoresist mask. The photoresist mask may be subsequently removed by ashing, dissolving the photoresist mask or by consuming the photoresist mask during the etch process.

The photolithographic process (e.g., processes) used to form the openings $O_{110b}$ may include forming a patterned photoresist mask (not shown) on the package substrate lower surface layer 110*b*, and etching (e.g., wet etching, dry etching, etc.) the exposed upper surface of the package substrate lower surface layer 110*b* through openings in the photoresist mask. The photoresist mask may be subsequently removed by ashing, dissolving the photoresist mask or by consuming the photoresist mask during the etch process.

After the openings $O_{110a}$ are formed in the package substrate upper surface layer 110*a* and the openings $O_{110b}$ are formed in the package substrate lower surface layer 110*b*, the package substrate upper surface layer 110*a* (upper solder resist layer) and the package substrate lower surface layer 110*b* may be cured such as by a thermal cure or ultraviolet (UV) cure.

Figure 2E:
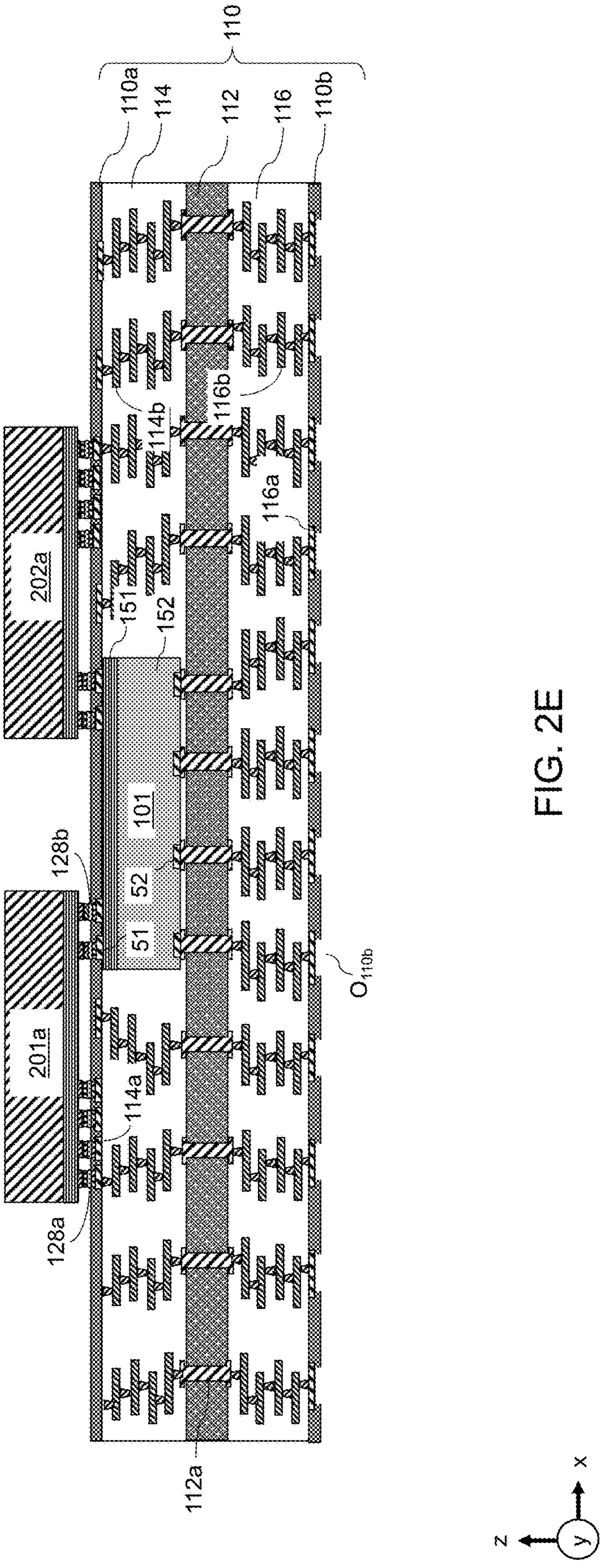
FIG. 2E illustrates a vertical cross-sectional view of an intermediate structure in which the first semiconductor die and the second semiconductor die may be mounted on the package substrate, according to one or more embodiments.

FIG. 2E illustrates a vertical cross-sectional view of an intermediate structure in which the first semiconductor die 201*a* and the second semiconductor die 202*a* may be mounted on the package substrate 110, according to one or more embodiments. The first semiconductor die 201*a* and the second semiconductor die 202*a* may be mounted on the package substrate 110, for example, by a flip chip bonding (FCB) process. As illustrated in FIG. 2E, the first microbumps 128*a* may be positioned on the package substrate upper bonding pads 114*a* of the package substrate 110 and heated in order to bond the first microbumps 128*a* to the package substrate upper bonding pads 114*a*. The second microbumps 128*b* may be positioned on the I/O pads 51 of the memory bridge die 101 and heated in order to bond the second microbumps 128*b* to the I/O pads 51.

Alternatively, the first semiconductor die 201*a* and second semiconductor die 202*a* may be bonded to the package substrate upper bonding pads 114*a* and I/O pads 51 by a hybrid bond. (i.e., a direct bond that may include a dielectric-to-dielectric bond, a polymer-to-polymer bond, and/or a metal-to-metal bond). In that case, bonding pads (not shown) within the first semiconductor die 201*a* and the second semiconductor die 202*a* may be positioned on the I/O pads 51 and the package substrate upper bonding pads 114*a*. In addition, an oxide layer and/or polymer layer of the first semiconductor die 201*a* and second semiconductor die 202*a* may be positioned on the package substrate upper surface layer 110*a*. The intermediate structure may then be heated to bond the bonding pads to the I/O pads 51 and the package substrate upper bonding pads 114*a*, and bond the oxide layer and/or polymer layer of the first semiconductor die 201*a* and second semiconductor die 202*a* to the package substrate upper surface layer 110*a*.

Figure 2F:
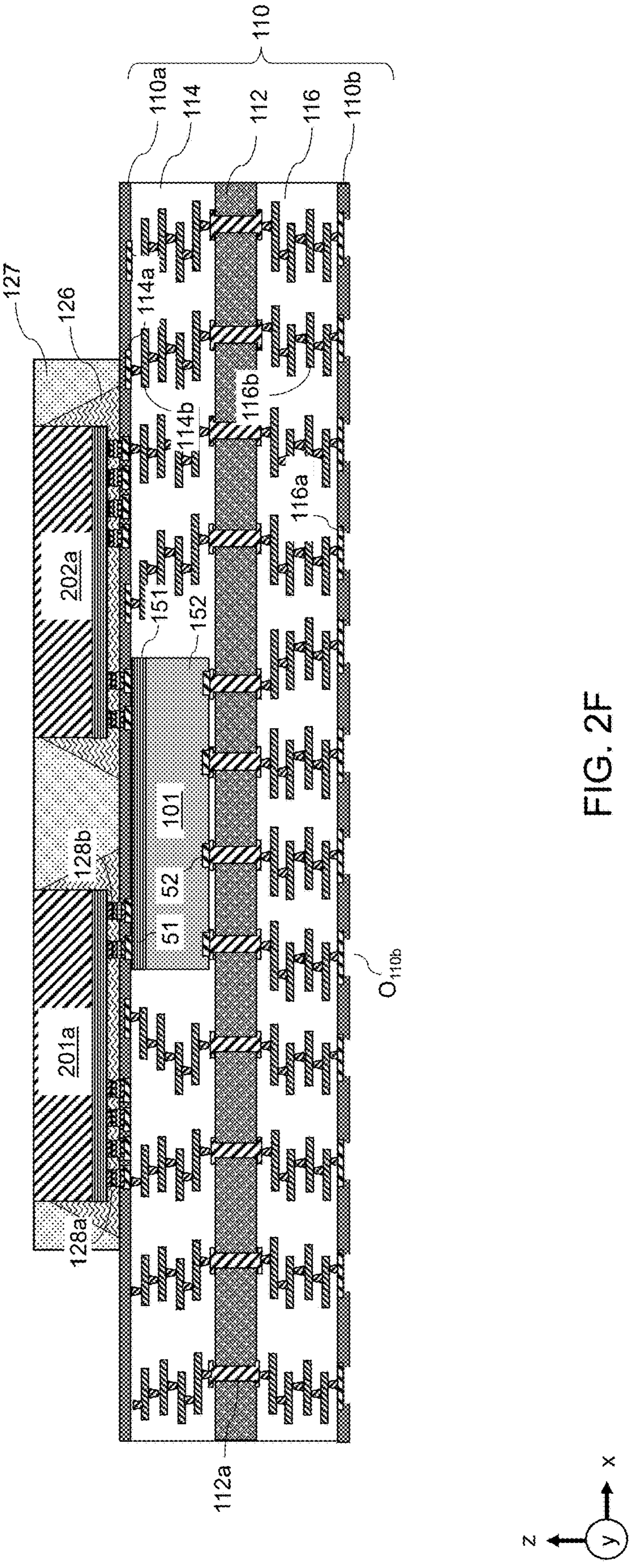
FIG. 2F illustrates a vertical cross-sectional view of an intermediate structure in which the package underfill layer may be formed on the package substrate according to one or more embodiments.

FIG. 2F illustrates a vertical cross-sectional view of an intermediate structure in which the package underfill layer 126 may be formed on the package substrate 110 according to one or more embodiments. The package underfill layer 126 may be formed of an epoxy-based polymeric material. As illustrated in FIG. 2F, the package underfill layer 126 may be formed (e.g., injected) under and around the first semiconductor die 201*a*, the second semiconductor die 202*a*, and the first microbumps 128*a* and second microbumps 128*b*, so as to fix the first semiconductor die 201*a* and the second semiconductor die 202*a* to the package substrate 110. The package underfill layer 126 may then be cured, for example, in a box oven for about 90 minutes at about 150° C. to provide the package underfill layer 126 with a sufficient stiffness and mechanical strength.

The intermediate structure may then be placed in a mold, and an epoxy molding compound (EMC) may then be deposited on the first semiconductor die 201*a*, second semiconductor die 202*a*, the package underfill layer 126 and the package substrate 110 to form the molding material layer 127. After the EMC has cured, the mold may be removed.

Figure 2G:
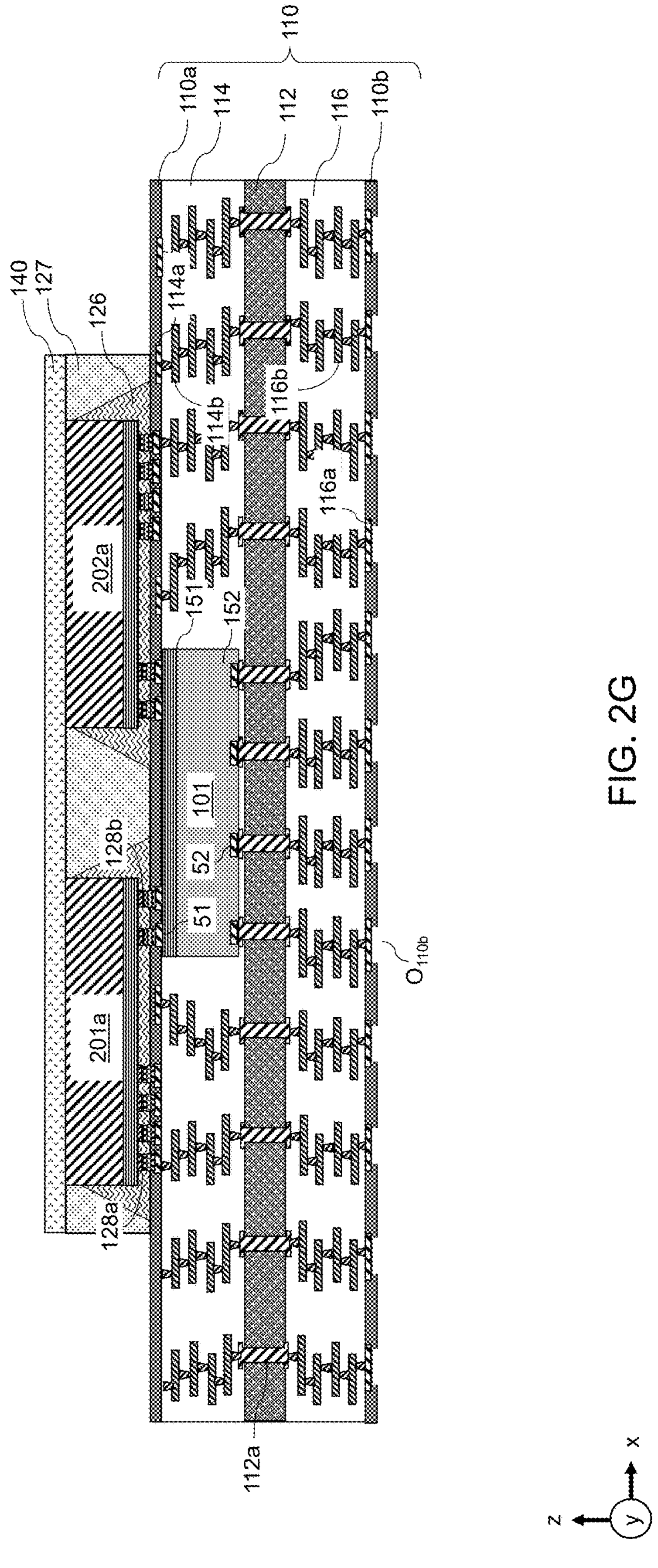
FIG. 2G illustrates a vertical cross-sectional view of an intermediate structure in which the TIM layer may be attached to the upper surface of the first semiconductor die and second semiconductor die, according to one or more embodiments.

FIG. 2G illustrates a vertical cross-sectional view of an intermediate structure in which the TIM layer 140 may be attached to the upper surface of the first semiconductor die 201*a* and second semiconductor die 202*a*, according to one or more embodiments. The TIM layer 140 may include, for example, a gel TIM, graphite TIM, metal TIM, solder TIM and a carbon nanotube TIM. The TIM layer 140 may be attached to the upper surface of the first semiconductor die 201*a* and second semiconductor die 202*a*, by applying a thermally conductive adhesive to the upper surface of the first semiconductor die 201*a* and second semiconductor die 202*a* (or to a bottom surface of the TIM layer 140) and then pressing the TIM layer 140 onto the first semiconductor die 201*a* and the second semiconductor die 202*a*.

Figure 2H:
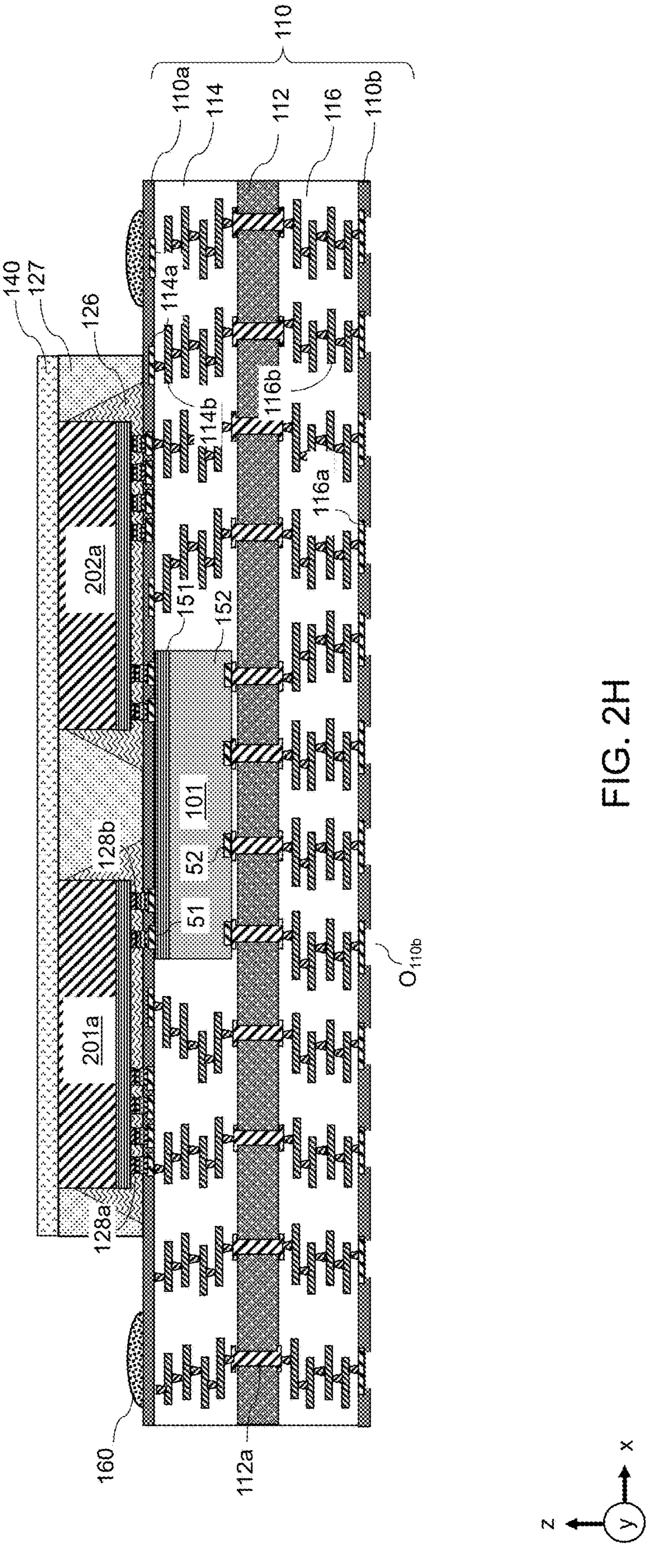
FIG. 2H illustrates a vertical cross-sectional view of an intermediate structure in which the adhesive may be applied to the package substrate according to one or more embodiments.

FIG. 2H illustrates a vertical cross-sectional view of an intermediate structure in which the adhesive 160 may be applied to the package substrate 110 according to one or more embodiments. The adhesive may include, for example, a silicone adhesive or an epoxy adhesive. The adhesive may be located on the package substrate 110 at a position corresponding to a placement of the package lid foot portion 130*b* and in a quantity sufficient to securely bond the package lid foot portion 130*b* to the package substrate 110.

Figure 2I:
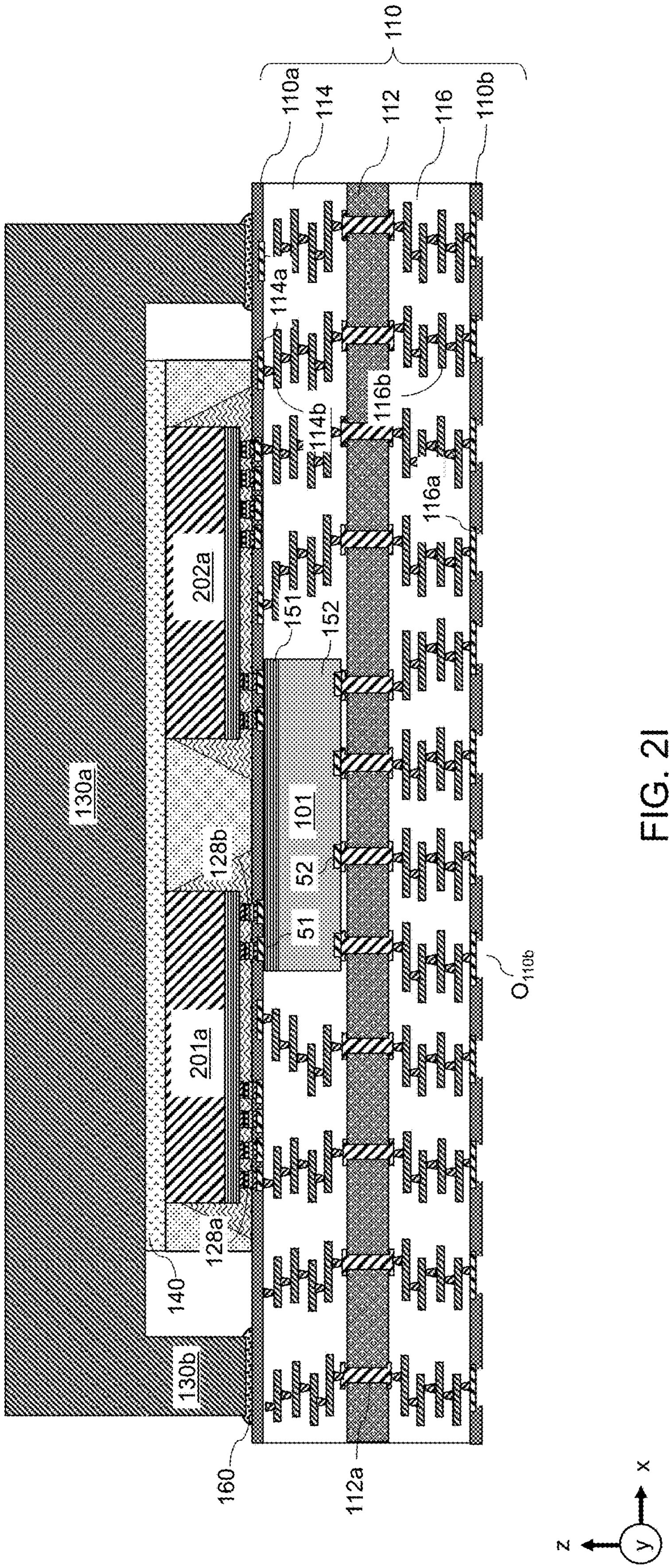
FIG. 2I illustrates a vertical cross-sectional view of an intermediate structure in which the package lid may be attached to (e.g., mounted on) the package substrate according to one or more embodiments.

FIG. 2I illustrates a vertical cross-sectional view of an intermediate structure in which the package lid 130 may be attached to (e.g., mounted on) the package substrate 110 according to one or more embodiments. As noted above, the package lid 130 may be composed of metal, ceramic or plastic. The package lid 130 may be formed, for example, by milling using a computer numerical control (CNC) milling machine, or by molding or stamping.

In FIG. 2I, the package substrate 110 with the first semiconductor die 201*a* and second semiconductor die 202*a*, may be placed on a surface and the package lid foot portion 130*b* lowered down over the first semiconductor die 201*a* and second semiconductor die 202*a* and onto the package substrate 110. The package lid foot portion 130*b* may then be aligned with the adhesive 160 (e.g., ring of adhesive material) formed on the package substrate 110. The package lid plate portion 130*a* may then be lowered onto the TIM layer 140 and the package lid foot portion 130*b* may be lowered onto the adhesive 160 on the package substrate 110. The package lid 130 may then be clamped to the package substrate 110 for a period to allow the adhesive 160 to cure and form a secure bond between the package substrate 110 and the package lid foot portion 130*b*. The clamping of the package lid 130 to the package substrate 110 may be performed, for example, by using a heat clamp module. The heat clamp module may apply a uniform force across the upper surface of the package lid 130.

Alternatively, the package lid 130 may be placed on a surface (e.g., a flat surface), and the first semiconductor die 201*a* and second semiconductor die 202*a* (which are mounted on the package substrate 110) may be inverted and inserted into the package lid 130. A downward force may then be applied to the package substrate lower surface layer 110*b* of the package substrate 110, in order to bond the package substrate 110 to the package lid foot portion 130*b*.

The package lid 130 may then be aligned with the adhesive 160 and lowered onto the adhesive 160 and the TIM layer 140. The package lid 130 may then be clamped to the package substrate 110 for a period to allow the adhesive 160 to cure and form a secure bond between the package substrate 110 and the package lid 130. The clamping of the package lid 130 to the package substrate 110 may be performed, for example, by using a heat clamp module. The heat clamp module may apply a uniform force across the upper surface of the package lid 130.

Figure 2J:
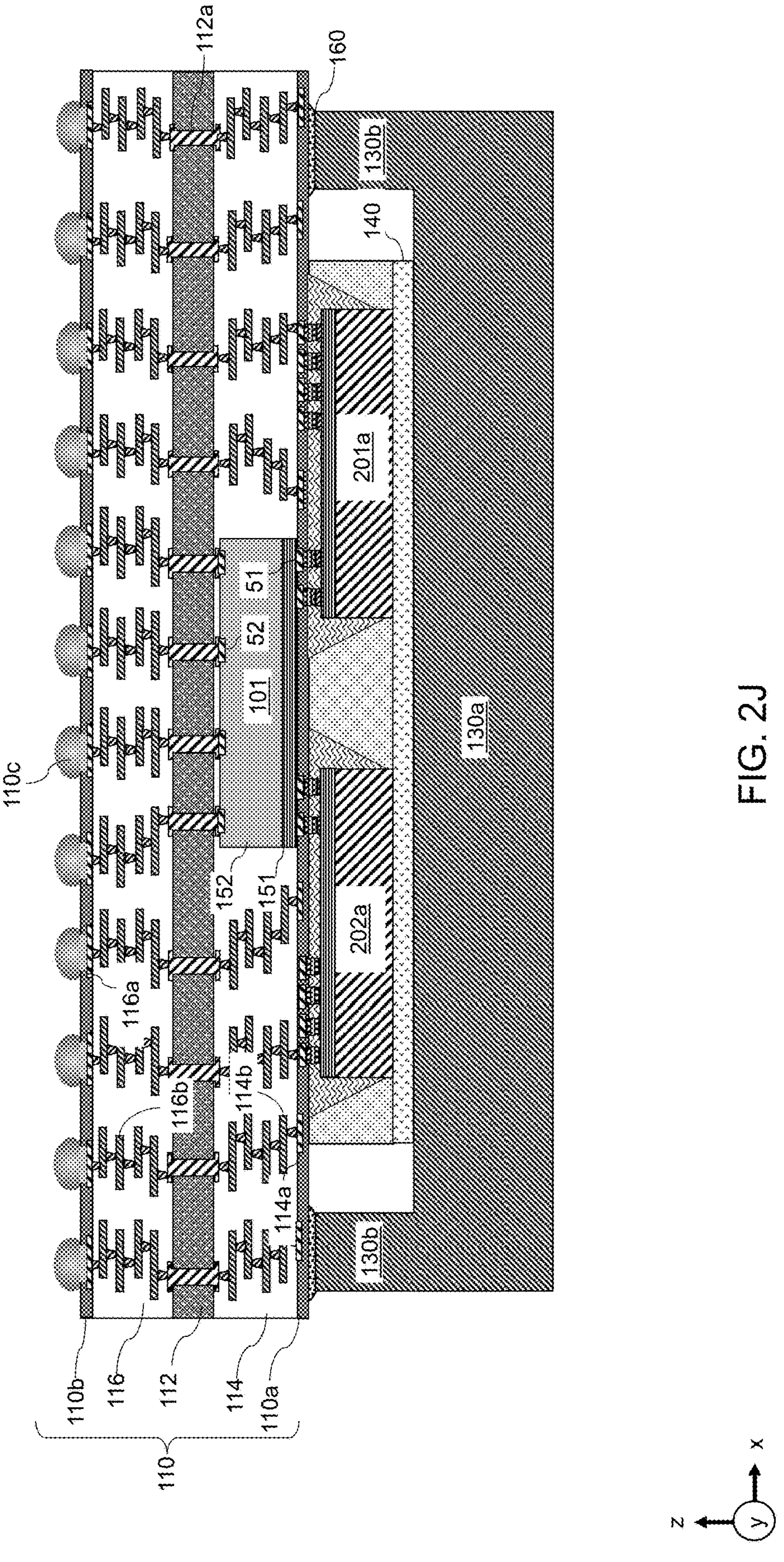
FIG. 2J illustrates a vertical cross-sectional view of an intermediate structure in which a plurality of solder balls may be formed on the package substrate according to one or more embodiments.

FIG. 2J illustrates a vertical cross-sectional view of an intermediate structure in which a plurality of solder balls 110*c* may be formed on the package substrate 110 according to one or more embodiments. The plurality of solder balls 110*c* may be formed on the lower bonding pads 116*a* through the openings in the package substrate lower surface layer 110*b*. The solder balls 110*c* may be formed, for example, by an electroplating process. The solder balls 110*c* may be formed, for example, so as to be located under the interposer module 120. The plurality of solder balls 110*c* may constitute a ball-grid array (BGA) that may allow the package structure 100 to be securely mounted (e.g., by surface mount technology (SMT)) on a substrate such as a printed circuit board and electrically coupled to the substrate. Formation of the solder balls 110*c* may complete the formation of the package structure 100.

Figure 3:
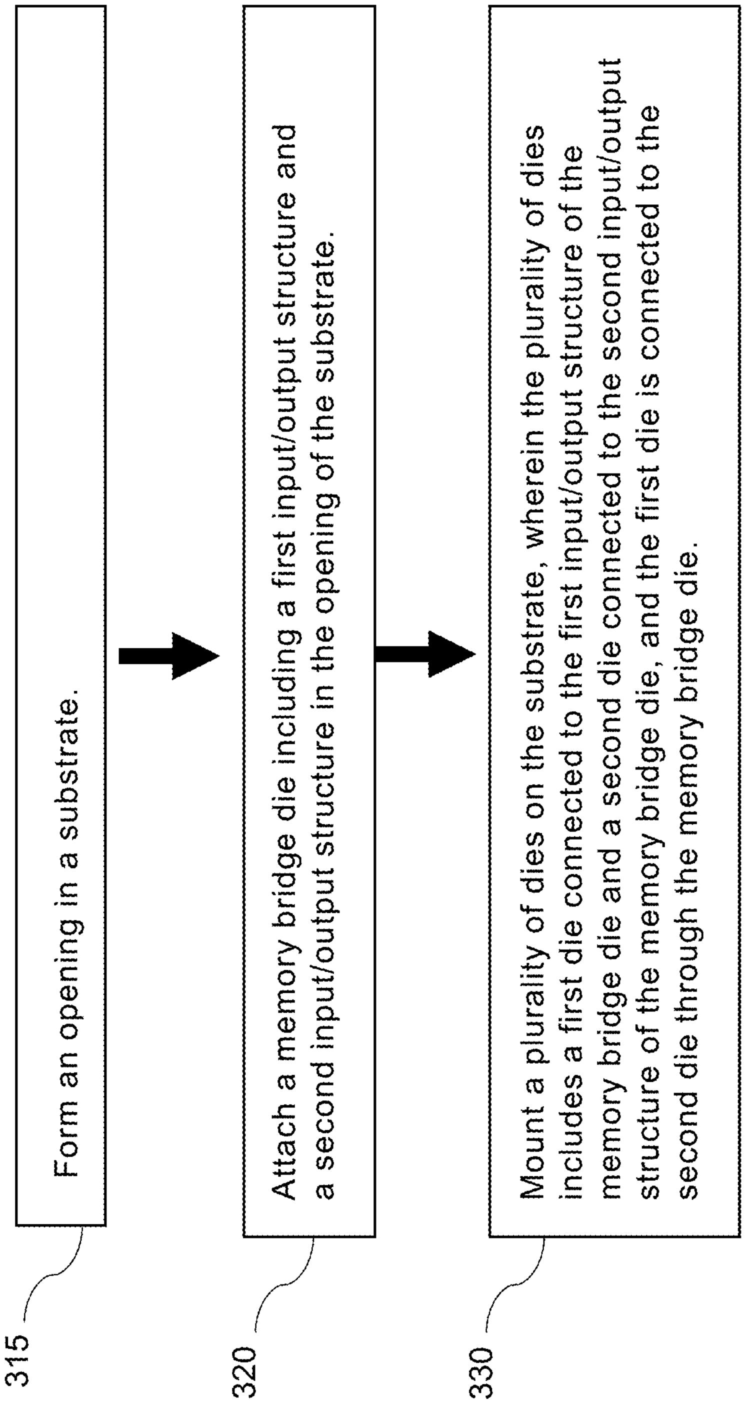
FIG. 3 is a flow chart illustrating a method of forming a package structure according to one or more embodiments.

FIG. 3 is a flow chart illustrating a method of forming a package structure according to one or more embodiments. Step 315 includes forming an opening in a substrate. Step 320 includes attaching a memory bridge die including a first input/output structure and a second input/output structure in the opening of the substrate. Step 330 includes mounting a plurality of dies on the substrate, wherein the plurality of dies includes a first semiconductor die connected to the first input/output structure of the memory bridge die and a second semiconductor die connected to the second input/output structure of the memory bridge die, and the first semiconductor die is connected to the second semiconductor die through the memory bridge die.

FIGS. 4A-4B illustrate plan views of alternative layouts of the plurality of semiconductor dies in the package structure 100, according to one or more embodiments. In particular, FIG. 4A illustrates a plan view of a first alternative layout of the plurality of semiconductor dies in the package structure 100, according to one or more embodiments. The first alternative layout may include first semiconductor dies 201*a* and 201*b* on a lateral side (in the x-direction) of the memory bridge die 101, and second semiconductor dies 202*a* and 202*b* on an opposite lateral side (in the x-direction) of the memory bridge die 101 from the first semiconductor dies 201*a* and 201*b*. A length (in the y-direction) of the memory bridge die 101 may be less than a combined width (in the y-direction) of the first semiconductor dies 201*a* and 201*b* (or a combined width of the second semiconductor dies 202*a* and 202*b*). Thus, only a corner portion of each of the first semiconductor dies 201*a* and 201*b* and second semiconductor dies 202*a* and 202*b*, may overlap the memory bridge die 101.

FIG. 4B illustrates a plan view of a second alternative layout of the plurality of semiconductor dies in the package structure 100, according to one or more embodiments. The second alternative layout may include first semiconductor dies 201*a*-201*c* on a lateral side (in the x-direction) of the memory bridge die 101, and second semiconductor dies 202*a*-202*c* on an opposite lateral side (in the x-direction) of the memory bridge die 101 from the first semiconductor dies 201*a*-201*c*. As illustrated in FIG. 4B, in the second alternative layout, the first semiconductor dies 201*a*-201*c* and second semiconductor dies 202*a*-202*c* may include different sizes (e.g., lengths and widths). In addition, spacing in the y-direction between the first semiconductor dies 201*a*-201*c* and second semiconductor dies 202*a*-202*c* may vary. The locations of the I/O pads 51 may also vary between the first semiconductor dies 201*a*-201*c* and second semiconductor dies 202*a*-202*c*.

The numbers of I/O pads 51 on the memory bridge dies 101 may also vary between the first semiconductor dies 201*a*-201*c* and second semiconductor dies 202*a*-202*c*. For example, each of the first semiconductor die 201*a* and the second semiconductor die 202*a* may be connected to two I/O pads 51 on the memory bridge die 101. However, each of the first semiconductor dies 201*b* and 201*c* and the second semiconductor dies 202*b* and 202*c* may be connected to only one I/O pad 51.

Figure 5:
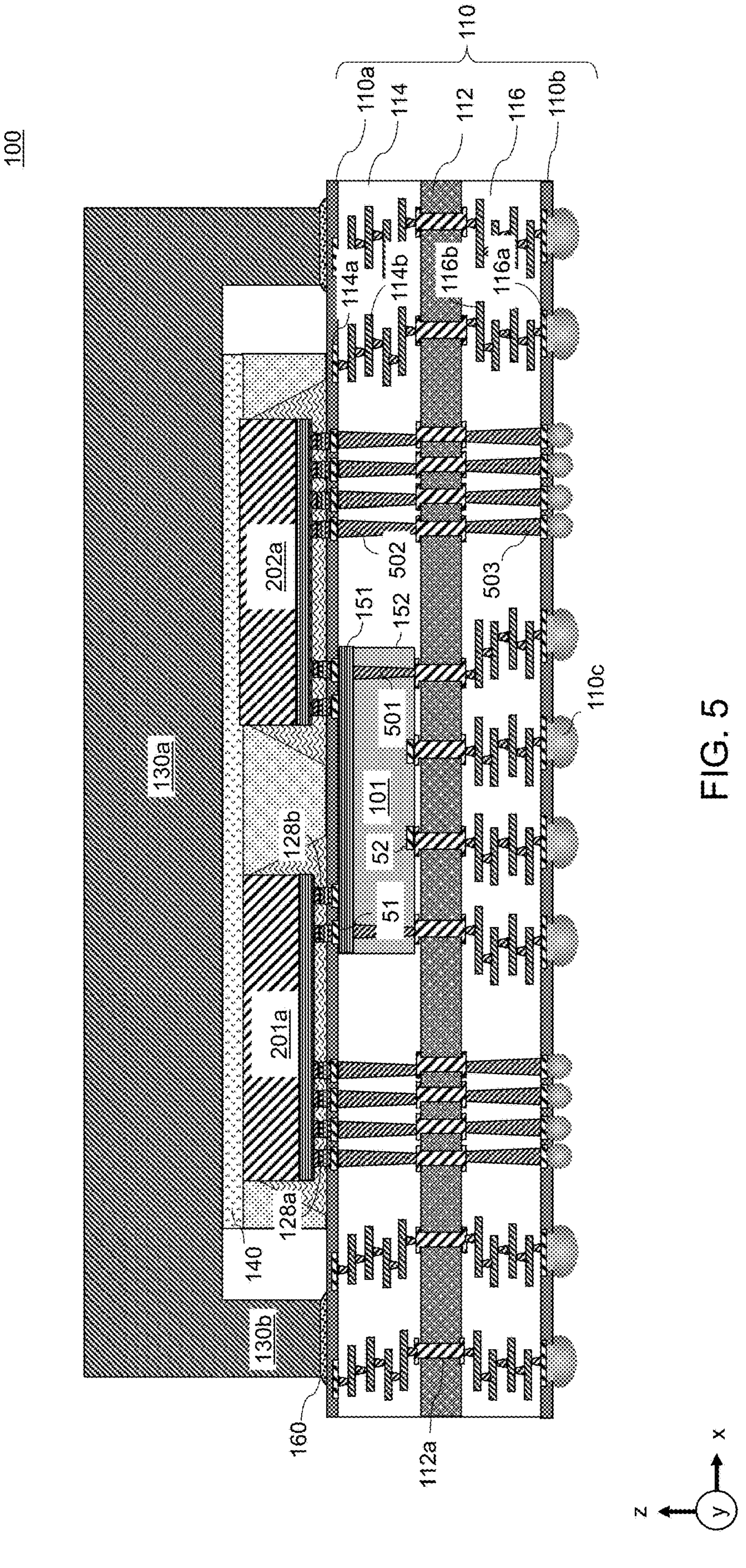
FIG. 5 illustrates a vertical cross-sectional view of the package structure having a first alternative design according to one or more embodiments.

FIG. 5 illustrates a vertical cross-sectional view of the package structure 100 having a first alternative design according to one or more embodiments. As illustrated in FIG. 5, in the first alternative design, the memory bridge die 101 may include one or more first through silicon vias (TSVs) 501 (e.g., memory bridge die TSVs). The first TSV's 501 may connect the active region 151 of the memory bridge die 101 to a through via 112*a* in the core 112 of the package substrate 110. This may allow the active region 151 of the memory bridge die 101 to be connected (e.g., indirectly connected through the metal interconnect structures 116*b*) to a solder ball 110*c* (e.g., package ball; BGA) on the board side of the package substrate 110.

The first alternative design may also include second TSVs 502 (e.g., package substrate TSVs) in the package substrate upper dielectric layer 114. The second TSVs 502 may connect the package substrate upper bonding pads 114*a* to the through vias 112*a* in the core 112 of the package substrate 110. The first alternative design may also include third TSVs 503 (e.g., package substrate TSVs) in the package substrate lower dielectric layer 116. The third TSVs 503 may connect the through vias 112*a* in the core 112 of the package substrate 110 to the package substrate lower bonding pads 116*a*. With this first alternative design, the first semiconductor dies 201*a* and second semiconductor dies 202*a* may be connected (e.g., directly connected) to the solder balls 110*c*. This may allow power to be applied (e.g., directly applied) to the first semiconductor die 201*a* and second semiconductor die 202*a* from the solder balls 110*c*.

Figure 6A:
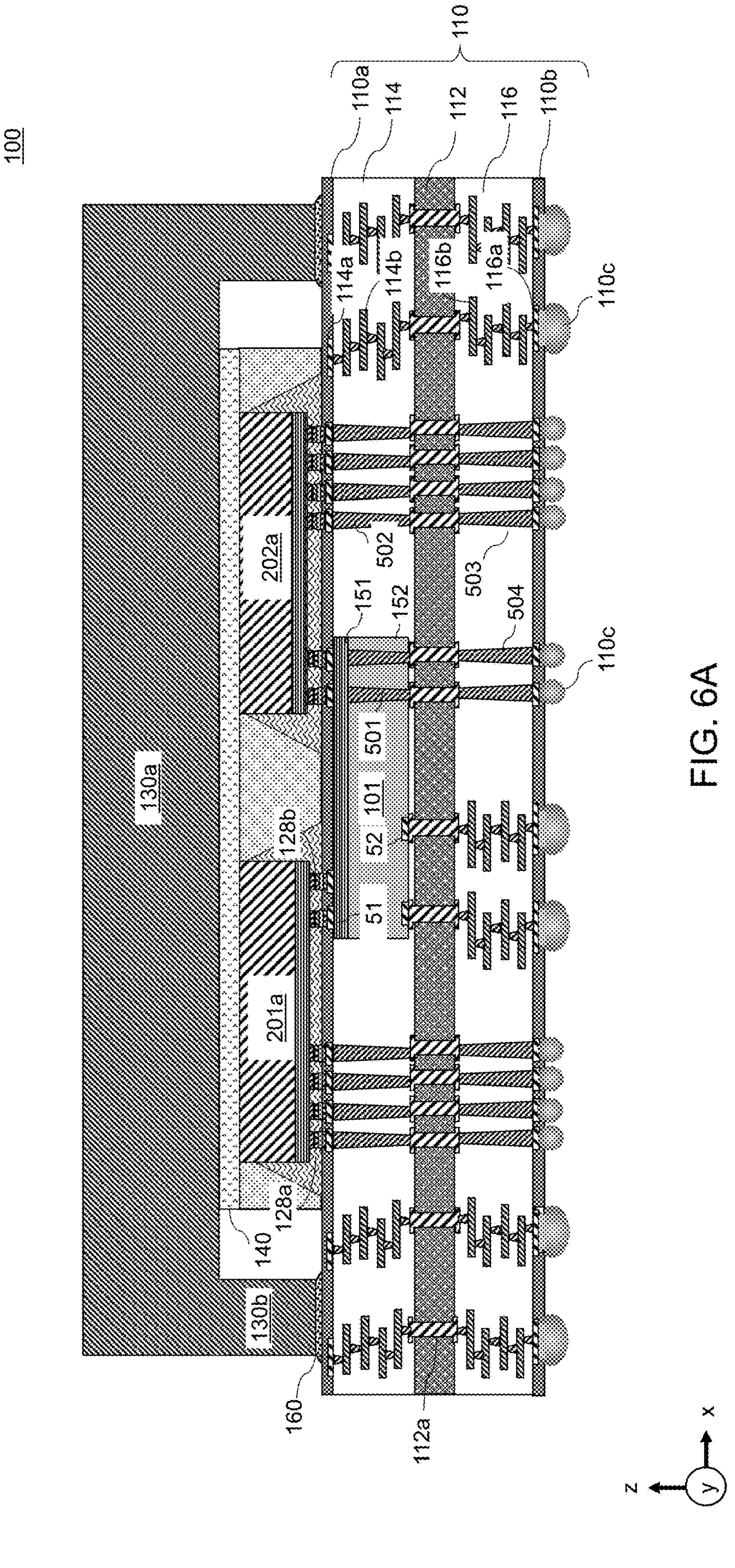
FIG. 6A illustrates a vertical cross-sectional view of the package structure having the second alternative design according to one or more embodiments.
Figure 6B:
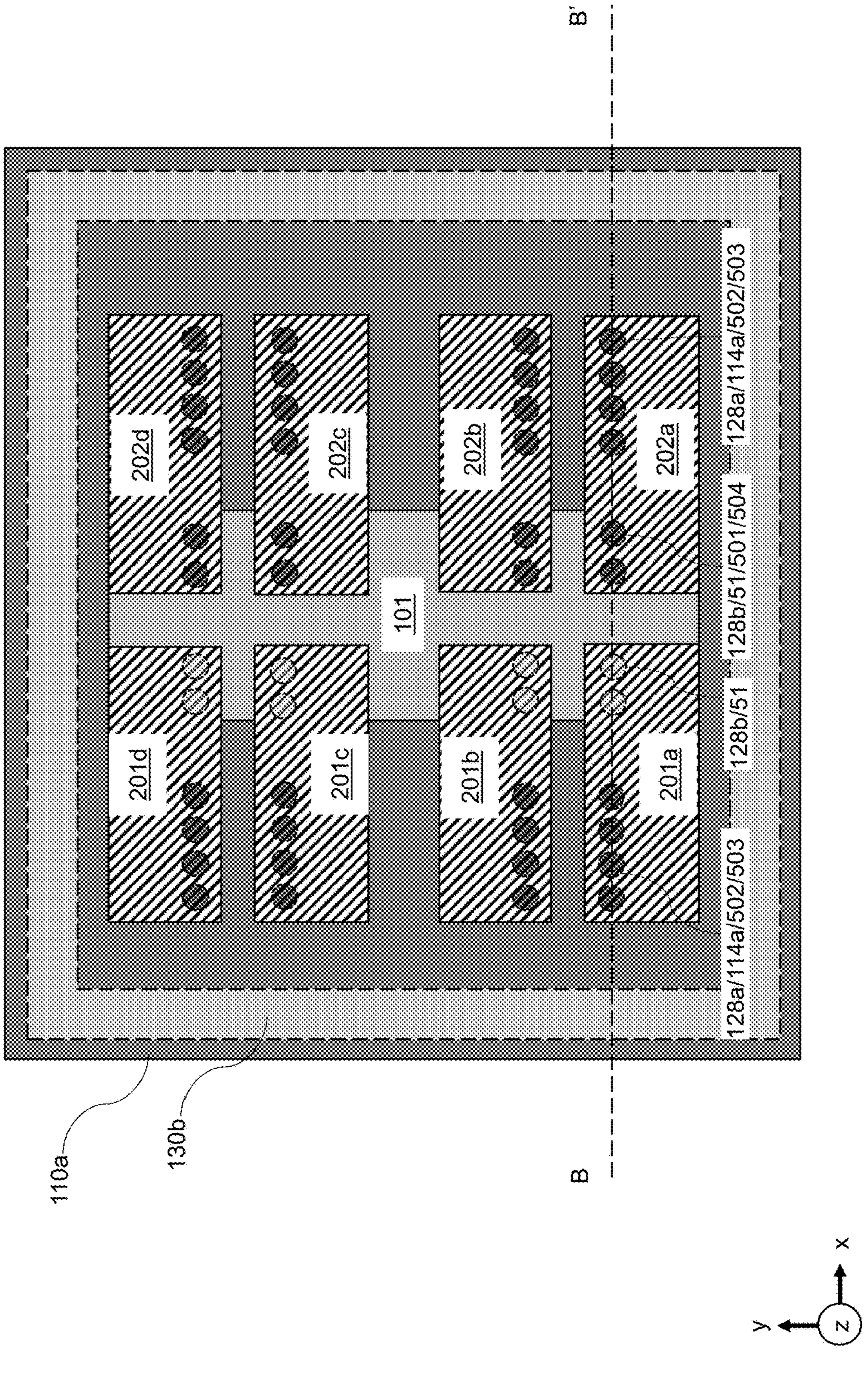
FIG. 6B illustrates a plan view (top-down view) of the package structure having the second alternative design according to one or more embodiments.

FIGS. 6A and 6B illustrate the package structure 100 having a second alternative design according to one or more embodiments. In particular, FIG. 6A illustrates a vertical cross-sectional view of the package structure 100 having the second alternative design according to one or more embodiments. FIG. 6B illustrates a plan view (top-down view) of the package structure 100 having the second alternative design according to one or more embodiments.

Referring to FIG. 6A, the vertical cross-sectional view in FIG. 6A may be along the line B-B' in FIG. 6B. As illustrated in FIG. 6A, the second alternative design of the package structure 100 may be similar to the first alternative design in FIG. 5. However, in the second alternative design, the package substrate 110 includes fourth TSVs 504 (e.g., package substrate TSVs) in the package substrate lower dielectric layer 116. The fourth TSVs 504 may connect (e.g., directly connect) the through vias 112*a* in the core 112 of the package substrate 110 to the lower bonding pads 116*a*. Therefore, the active region 151 of the memory bridge die 101 may be connected (e.g., directly connected) to the solder balls 110*c* by way of the first TSVs 501 in the memory bridge die 101, the through vias 112*a* and the fourth TSVs 504.

Thus, in the second alternative design, power may be applied directly from the solder ball 110*c* to the memory bridge die 101. This design may allow a power mesh design to be improved over typical package structures. In addition, the design may enable direct memory access between an external main memory (not shown) and the memory bridge die 101 and, thereby, provide high-bandwidth capability in the package structure 100.

FIG. 6B illustrates a location of the first TSVs 501, second TSVs 502, third TSVs 503 and fourth TSVs 504 in the second alternative design. In particular, FIG. 6B illustrates a location of the first TSVs 501, second TSVs 502, third TSVs 503 and fourth TSVs 504 with respect to the first semiconductor dies 201*a*-201*d* and with respect to the second semiconductor dies 202*a*-202*d*. As illustrated in FIG. 6B, the first semiconductor dies 201*a*-201*d* may be located over the second microbumps 128*b*. The first semiconductor dies 201*a*-201*d* may be connected to the memory bridge die 101 by the second microbumps 128*b* and the I/O pads 51. Further, the second microbumps 128*b* may be substantially aligned in the x-direction with the first microbumps 128*a*, second TSVs 502 in the package substrate upper dielectric layer 114, and third TSVs 503 in the package substrate lower dielectric layer 116.

However, the second semiconductor dies 202*a*-202*d* may be located over the second microbumps 128*b*, the I/O pads 51, the first TSVs 501 in the memory bridge die 101 and the fourth TSVs 504 in the package substrate lower dielectric layer 116. Further, the second microbumps 128*b*, first TSVs 501 and fourth TSVs 504 may be substantially aligned in the x-direction with the first microbumps 128*a*, second TSVs 502 in the package substrate upper dielectric layer 114, and third TSVs 503 in the package substrate lower dielectric layer 116.

Figure 7A:
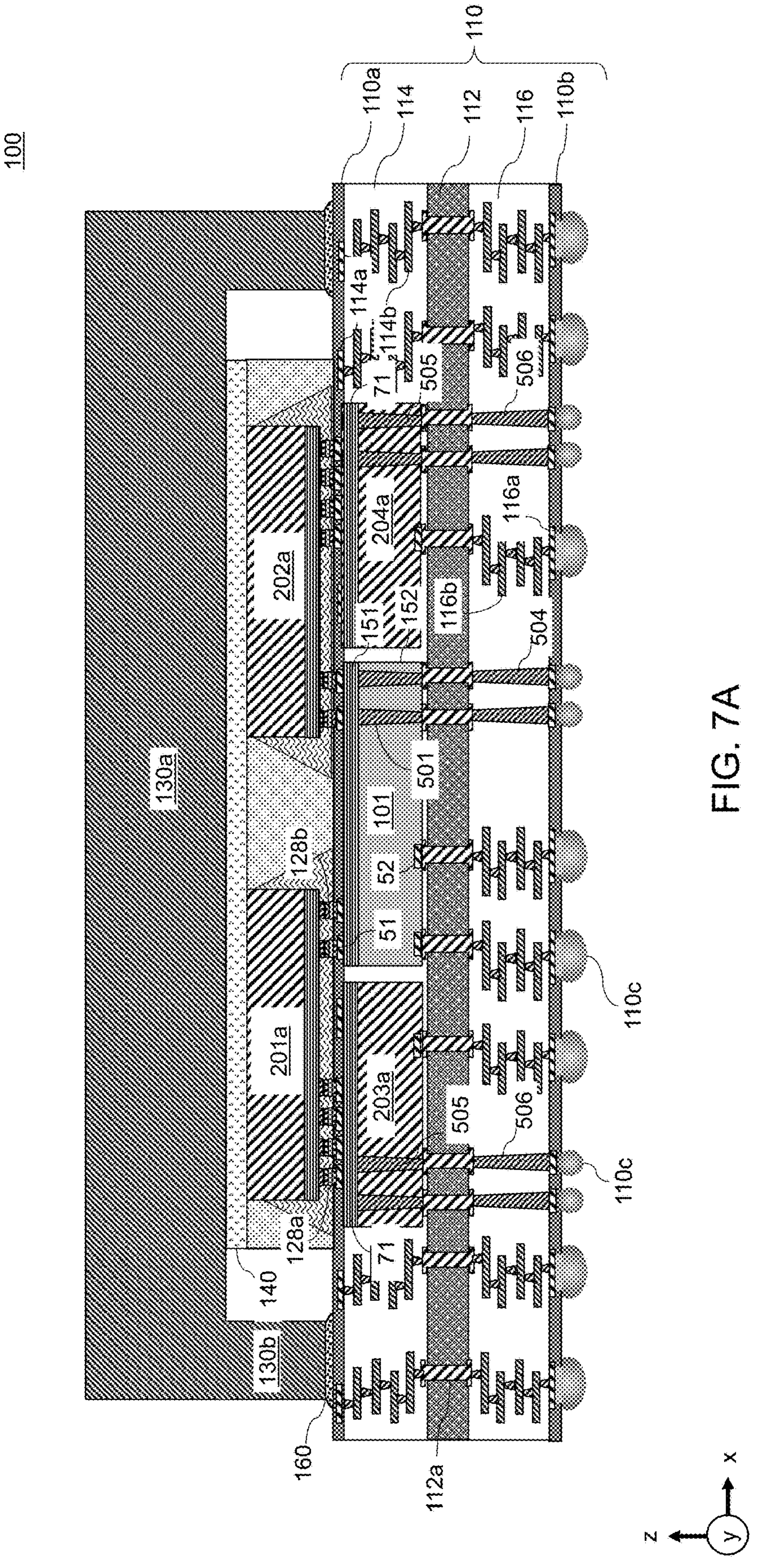
FIG. 7A illustrates a vertical cross-sectional view of the package structure having the third alternative design according to one or more embodiments.
Figure 7B:
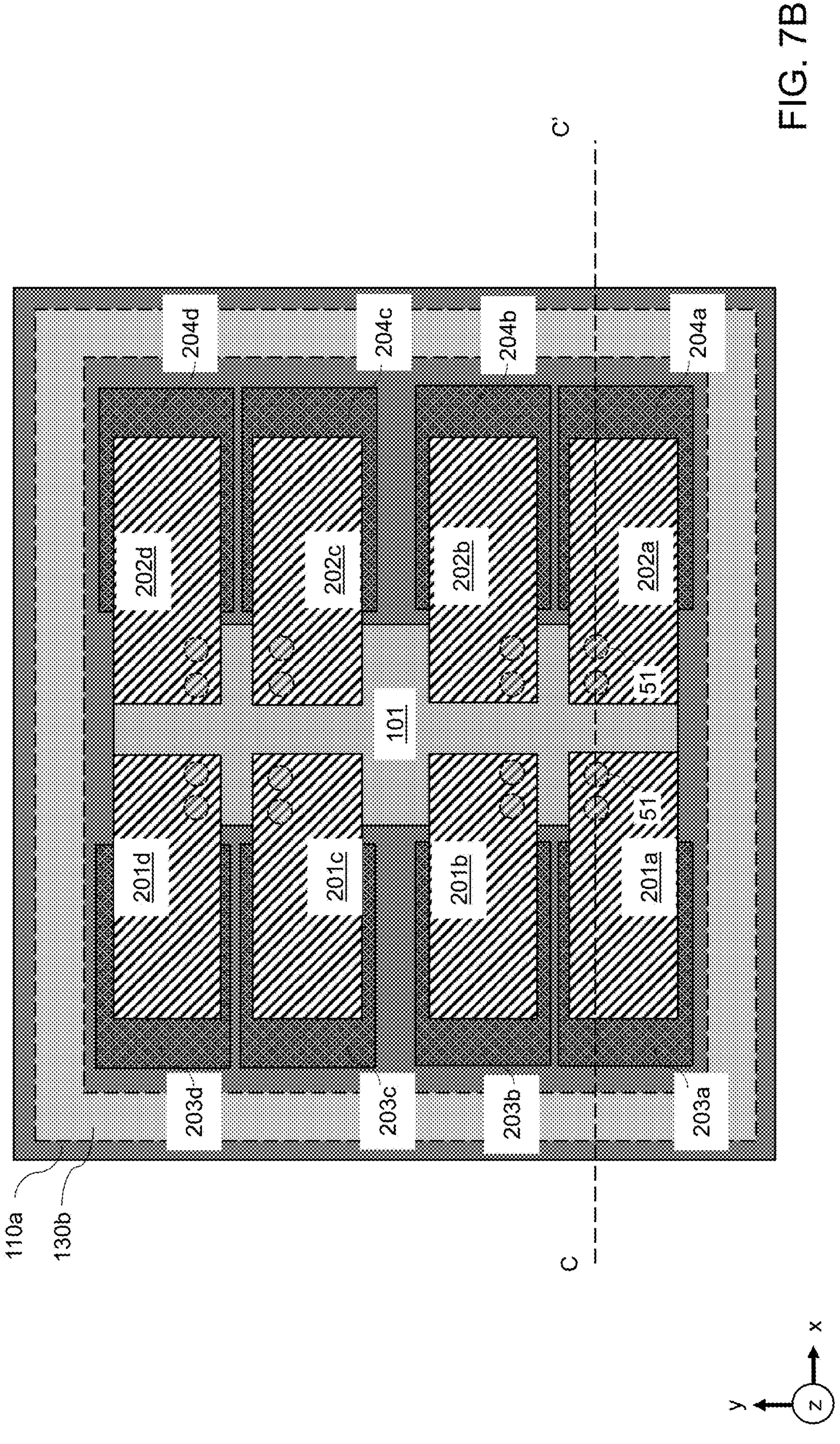
FIG. 7B illustrates a plan view (top-down view) of the package structure having the third alternative design according to one or more embodiments.

FIGS. 7A and 7B illustrate the package structure 100 having a third alternative design according to one or more embodiments. In particular, FIG. 7A illustrates a vertical cross-sectional view of the package structure 100 having the third alternative design according to one or more embodiments. FIG. 7B illustrates a plan view (top-down view) of the package structure 100 having the third alternative design according to one or more embodiments.

Referring to FIG. 7A, the vertical cross-sectional view in FIG. 7A may be along the line C-C' in FIG. 7B. As illustrated in FIG. 7A, in the third alternative design, in addition to the first semiconductor die 201*a* and second semiconductor die 202*a*, the package structure 100 may include a third semiconductor die 203*a* and a fourth semiconductor die 204*a*. The plurality of semiconductor dies in the package structure 100 may also include semiconductor dies 203*b*-203*d* and 204*b*-204*d* (see FIG. 7B) that are not shown in FIG. 7A.

The third semiconductor die 203*a* and a fourth semiconductor die 204*a* may have a structure and function substantially similar to the structure and function of the first semiconductor die 201*a* and second semiconductor die 202*a* described above. The third semiconductor die 203*a* and a fourth semiconductor die 204*a* may be embedded in the package substrate upper dielectric layer 114 on opposing sides (in the x-direction) of the memory bridge die 101. The upper surface of the package substrate upper dielectric layer 114 may be substantially coplanar with an upper surface of the third semiconductor die 203*a* and an upper surface of the fourth semiconductor die 204*a*.

The first semiconductor die 201*a* may be mounted on the third semiconductor die 203*a* by the first microbumps 128*a*, and mounted on the memory bridge die 101 by the second microbumps 128*b*. The second semiconductor die 202*a* may be mounted on the fourth semiconductor die 204*a* by the first microbumps 128*a*, and mounted on the memory bridge die 101 by the second microbumps 128*b*.

The third semiconductor die 203*a* and a fourth semiconductor die 204*a* may each include a semiconductor die active region 71. The third semiconductor die 203*a* and a fourth semiconductor die 204*a* may be oriented facing upward so that the semiconductor die active region 71 is located at the upper surface of the package substrate upper dielectric layer 114. The third semiconductor die 203*a* and a fourth semiconductor die 204*a* may each also include fifth TSVs 505 (e.g., semiconductor die TSVs) that connect the semiconductor die active region 71 to through via 112*a* in the core 112 of the package substrate 110. In addition, sixth TSVs 506 (e.g., package substrate TSVs) may be located in the package substrate lower dielectric layer 116 and connect the through vias 112*a* to the package substrate lower bonding pads 116*a*. Thus, the semiconductor die active region 71 of each of the third semiconductor die 203*a* and fourth semiconductor die 204*a* may be connected (e.g., electrically coupled to) the solder balls 110*c* through the fifth TSVs 505, the through vias 112*a*, the sixth TSVs 506 and the package substrate lower bonding pads 116*a*.

The package structure 100 may include 3D-integrated structure. The first semiconductor die 201*a* and the second semiconductor die 202*a* may be connected (e.g., directly connected) to the memory bridge die 101 by the I/O pads 51. The third semiconductor die 203*a* and the fourth semiconductor die 204*a* may not be directly connected to the memory bridge die 101. However, the third semiconductor die 203*a* may be connected to the memory bridge die 101 through the first semiconductor die 201*a*. The third semiconductor die 203*a* may also be connected to the second semiconductor die 202*a* through the first semiconductor die 201*a* and the memory bridge die 101. The third semiconductor die 203*a* may also be connected to the fourth semiconductor die 204*a* through the first semiconductor die 201*a*, the memory bridge die 101 and the second semiconductor die 202*a*.

The fourth semiconductor die 204*a* may be connected to the memory bridge die 101 through the second semiconductor die 202*a*. The fourth semiconductor die 204*a* may also be connected to the first semiconductor die 201*a* through the second semiconductor die 202*a* and the memory bridge die 101. The fourth semiconductor die 204*a* may also be connected to the third semiconductor die 203*a* through the second semiconductor die 202*a*, the memory bridge die 101 and the first semiconductor die 201*a*.

The method of forming the third alternative design of the package structure 100 in FIG. 7A may be similar to the method of forming the original design in FIG. 1A. In particular, the third semiconductor die 203*a* and the fourth semiconductor die 204*a* may be formed in the package substrate upper dielectric layer 114 using the same process that was used to form the memory bridge die 101 in the package substrate upper dielectric layer 114.

As illustrated in FIG. 7B, the first semiconductor dies 201*a*-201*d* may be located over the third semiconductor dies 203*a*-203*d*, respectively. The third semiconductor dies 203*a*-203*d* may extend laterally (in the x-direction) past an outer sidewall of the first semiconductor dies 201*a*-201*d*, respectively. The second semiconductor dies 202*a*-202*d* may be located over the fourth semiconductor dies 204*a*-204*d*, respectively. The fourth semiconductor dies 204*a*-204*d* may extend laterally (in the x-direction) past an outer sidewall of the second semiconductor dies 202*a*-202*d*, respectively. A shape of the third semiconductor die 203*a*-203*d* and a shape of the fourth semiconductor dies 204*a*-204*d* may be the same or different than the shape of the first semiconductor die 201*a*-201*d* and a shape of the second semiconductor dies 202*a*-202*d*.

Figure 8:
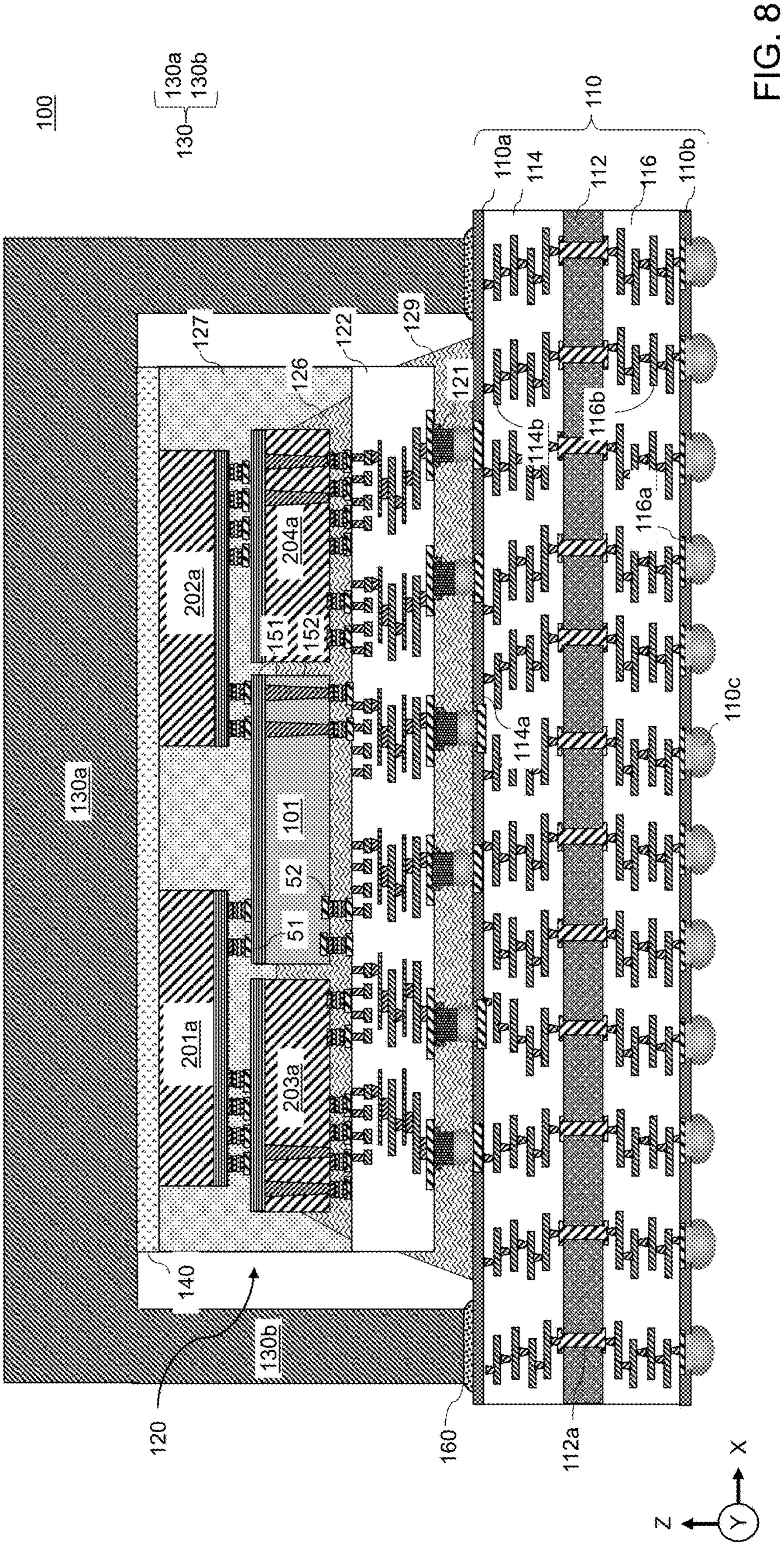
FIG. 8 illustrates a vertical cross-sectional view of the package structure having a fourth alternative design, according to one or more embodiments.

FIGS. 8-11 illustrate vertical cross-sectional views of the package structure 100 having various alternative designs in which the memory bridge die 101 may be formed on an interposer 122, according to one or more embodiments. In particular, FIG. 8 illustrates a vertical cross-sectional view of the package structure 100 having a fourth alternative design, according to one or more embodiments.

The package structure 100 may include a 3D integrated structure including additional dies (e.g., semiconductor dies in addition to the first semiconductor die 201*a* and the second semiconductor die 202*a*) which may not directly connect to the memory bridge die 101. In this case, the memory bridge die 101 may have a multi-die arrangement that is either face to face (F2F) or face to back (F2B). In the F2F arrangement, the memory bridge die 101 may have a multi-die connection with a greater bandwidth and greater performance compared to the F2B arrangement. In the F2B arrangement, the multi-die connection may have a more stable connection to solder balls 110*c* (e.g., package balls), more stable power rails, and greater external communication bandwidth.

As illustrated in FIG. 8, in the fourth alternative design, the package structure 100 may include an interposer module 120 including an interposer 122. The memory bridge die 101 may be mounted on the interposer 122. The interposer 122 may be mounted on the package substrate 110 by C4 bumps 121 (e.g., metal interconnect structures). The interposer 122 may include, for example, glass, ceramic, glass-epoxy, glass polyimide, silicon, single crystal silicon, polysilicon and so on. The interposer 122 may include, for example, metallization including metal lines or layers and metal vias. The metallization may include any type of conductive traces (depending on pitch or dimension).

In the fourth alternative design, the interposer module 120 may also include the memory bridge die 101, first semiconductor die 201*a*, second semiconductor die 202*a*, third semiconductor die 203*a* and fourth semiconductor die 204*a*. The structure, function, arrangement and interconnection of the memory bridge die 101, first semiconductor die 201*a*, second semiconductor die 202*a*, third semiconductor die 203*a* and fourth semiconductor die 204*a* in the fourth alternative design may be substantially the same as in the third alternative design in FIGS. 7A and 7B. However, in contrast to the third alternative design in FIGS. 7A and 7B, in the fourth alternative design, each of the memory bridge die 101, first semiconductor die 201*a*, second semiconductor die 202*a*, third semiconductor die 203*a* and fourth semiconductor die 204*a* may be mounted on the interposer 122.

In particular, the memory bridge die 101 may be mounted on the interposer 122 by interconnect structures such as microbumps. The third semiconductor die 203*a* may be mounted on the interposer 122 on a side of the memory bridge die 101, and the fourth semiconductor die 204*a* may be mounted on a side of the memory bridge die 101 opposite the third semiconductor die 203*a*. The package underfill layer 126 may be formed on and around the memory bridge die 101, the third semiconductor die 203*a* and the fourth semiconductor die 204*a*.

The first semiconductor die 201*a* may be mounted (e.g., by microbumps) partly on memory bridge die 101 and partly on the third semiconductor die 203*a*. The second semiconductor die 202*a* may be mounted (e.g., by microbumps) partly on memory bridge die 101 and partly on the fourth semiconductor die 204*a*. The molding material layer 127 may be formed on, around and under the memory bridge die 101, first semiconductor die 201*a*, second semiconductor die 202*a*, third semiconductor die 203*a* and fourth semiconductor die 204*a* may be mounted on the interposer 122. The molding material layer 127 may also be formed on the package underfill layer 126 and the interposer 122.

The TIM layer 140 may be formed on the interposer module 120. In particular, the TIM layer 140 may be formed on the upper surface of the first semiconductor die 201*a*, the upper surface of the second semiconductor die 202*a* and the upper surface of the molding material layer 127. The package lid 130 may be mounted on the package substrate 110 and attached to the package substrate 110 by the adhesive 160.

Figure 9:
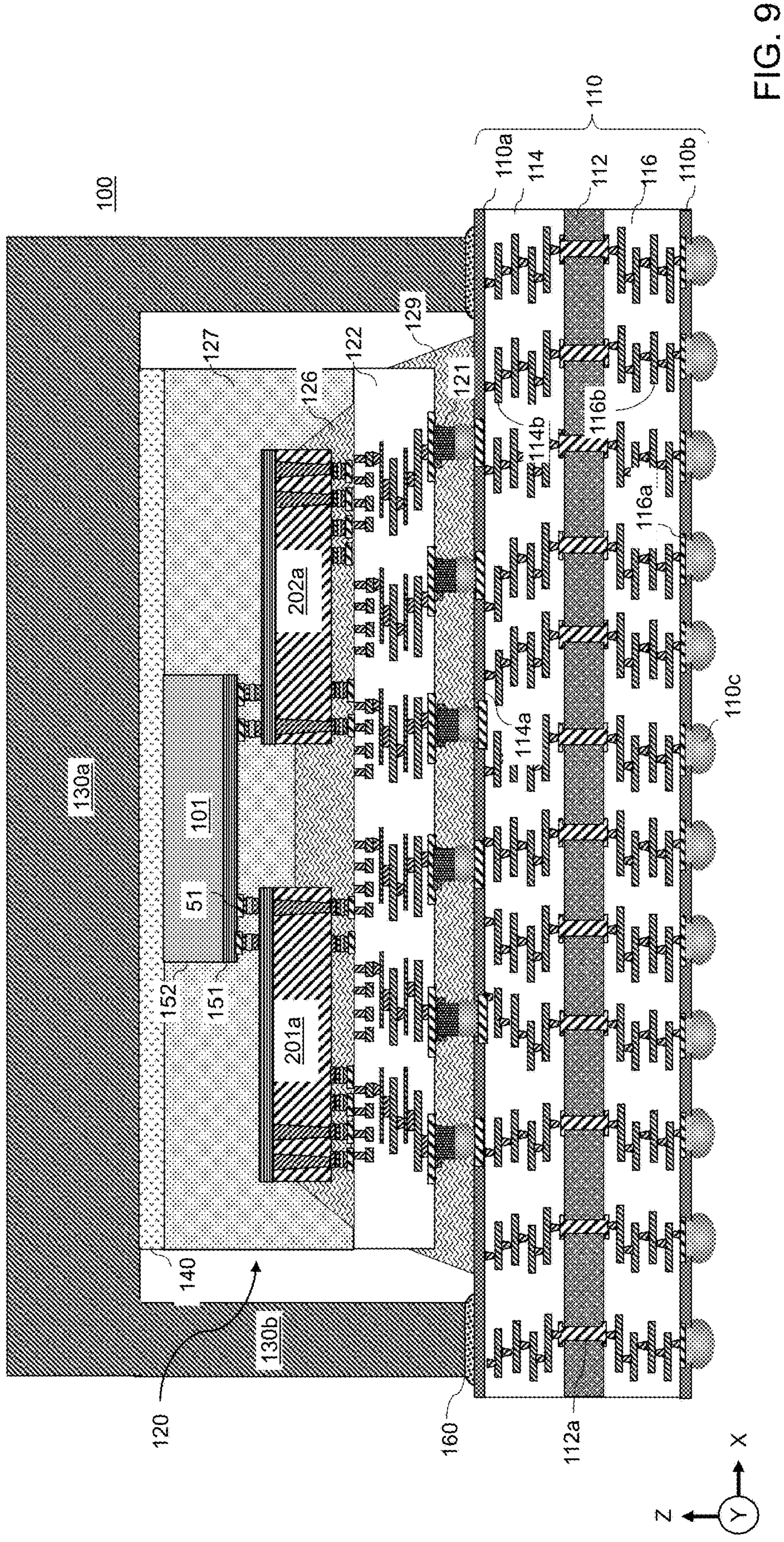
FIG. 9 illustrates a vertical cross-sectional view of the package structure having a fifth alternative design, according to one or more embodiments.

FIG. 9 illustrates a vertical cross-sectional view of the package structure 100 having a fifth alternative design, according to one or more embodiments. As illustrated in FIG. 9, in the fifth alternative design, the interposer module 120 may again be mounted on the package substrate 110 by the C4 bumps 121.

The memory bridge die 101 may be disposed either on (upside) or beneath (bottom-side) the first semiconductor die 201*a* and the second semiconductor die 202*a* in a multi-die integration. In contrast to the bottom-side cases described above (e.g., FIG. 1A) where the memory bridge die 101 may be disposed beneath the first semiconductor die and second semiconductor die 202*a* (in the z-direction), the fifth alternative design may provide an upside case wherein the memory bridge die 101 is disposed above the first semiconductor die and second semiconductor die 202*a*. Similar to a bottom-side embodiment, any memory bridge die 101 and any semiconductor die (e.g., logic die) may be implemented in or on the substrate or the interposer. This may enable more flexible 3D integration.

The first semiconductor die 201*a* and the second semiconductor die 202*a* may be mounted (e.g., by microbumps) on the interposer 122. The package underfill layer 126 may be formed on and around the first semiconductor die 201*a* and the second semiconductor die 202*a*.

The memory bridge die 101 may be mounted on the first semiconductor die 201*a* and on the second semiconductor die 202*a*. In particular, the memory bridge die 101 may have a face-to-face (F2F) arrangement with the first semiconductor die 201*a* and the second semiconductor die 202*a*. Thus, one or more I/O pads 51 on the face side of the memory bridge die 101 may be connected (e.g., by microbumps) to the face side (e.g., active region side) of the first semiconductor die 201*a* and to the face side of the second semiconductor die 202*a*. Thus, the first semiconductor die 201*a* may be connected to the memory bridge die 101 through the I/O pads 51. The second semiconductor die 202*a* may be connected to the memory bridge die 101 through the I/O pads 51. The first semiconductor die 201*a* may also be connected to the second semiconductor die 202*a* through the memory bridge die 101 and the I/O pads 51.

Further, the first semiconductor die 201*a* and the second semiconductor die 202*a* may include TSVs connecting the active regions of the first semiconductor die 201*a* and the second semiconductor die 202*a* to the interposer 122. The TSVs in the first semiconductor die 201*a* and the second semiconductor die 202*a* may allow the memory bridge die 101 to have efficient access to the interposer 122.

The molding material layer 127 may be formed on, around and under the memory bridge die 101. The molding material layer 127 may also be formed on the upper surface of the first semiconductor die 201*a* and the upper surface of the second semiconductor die 202*a*. The molding material layer 127 may also be formed on the package underfill layer 126 and the interposer 122.

It should be noted that in an alternative design, the molding material layer 127 may not be formed around first semiconductor die 201*a* and the second semiconductor die 202*a*. In that case, the memory bridge die 101 may be formed separately in the molding material layer 127, and the molding material layer 127 with the memory bridge die 101 therein, may be mounted on the first semiconductor die 201*a* and the second semiconductor die 202*a*.

The TIM layer 140 may be formed on the interposer module 120. In particular, the TIM layer 140 may be formed on the upper surface of the memory die module 101 (e.g., the backside surface of the memory bridge die 101) and the upper surface of the molding material layer 127. The package lid 130 may be mounted over the interposer module 120 on the package substrate 110 and attached to the package substrate 110 by the adhesive 160.

Figure 10:
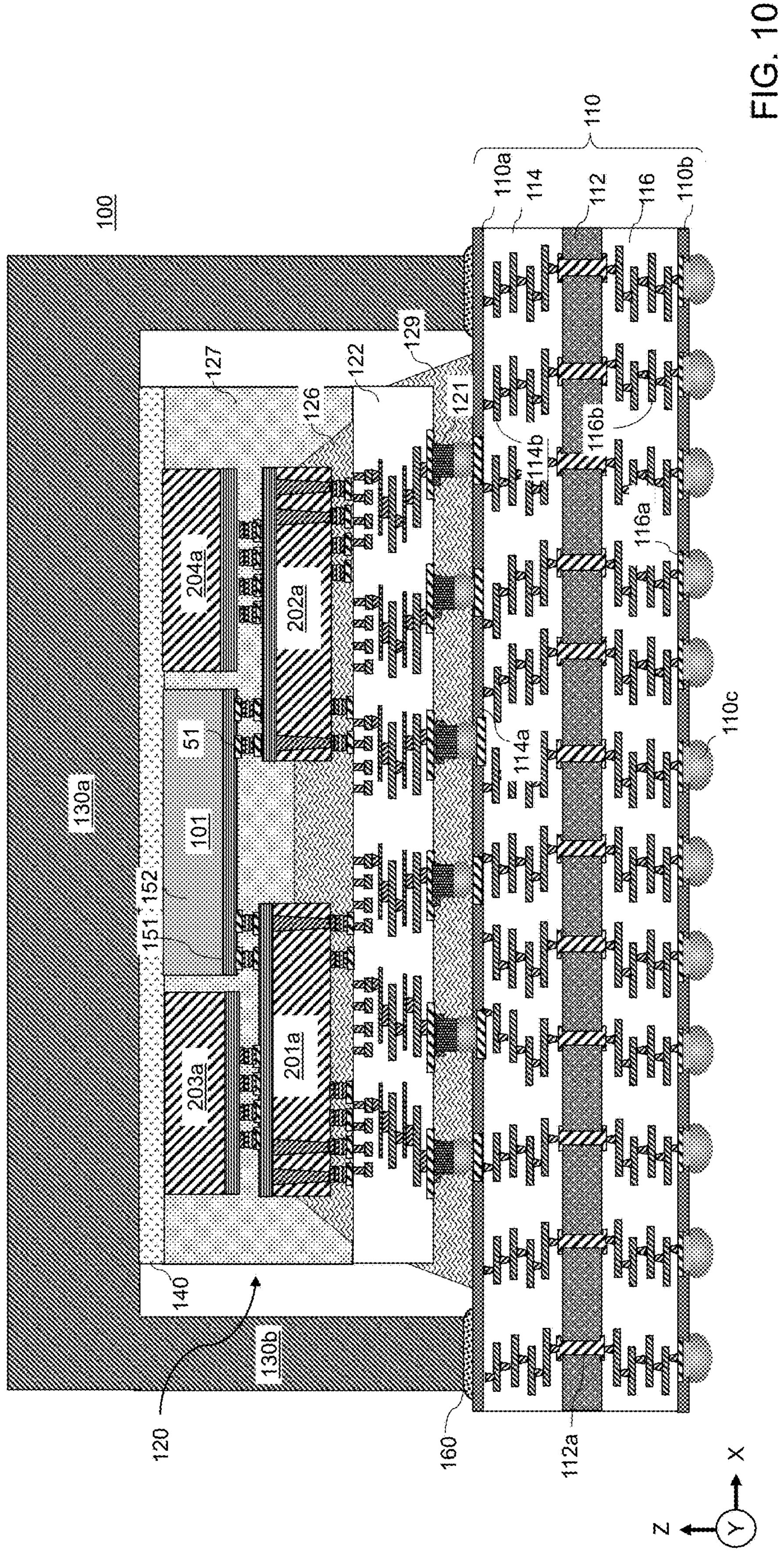
FIG. 10 illustrates a vertical cross-sectional view of the package structure having a sixth alternative design, according to one or more embodiments.

FIG. 10 illustrates a vertical cross-sectional view of the package structure 100 having a sixth alternative design, according to one or more embodiments. As illustrated in FIG. 10, in the sixth alternative design, the interposer module 120 may be similar in structure and function to the interposer module 120 in the fifth alternative design of FIG. 9. However, the interposer module 120 in the sixth alternative design may additionally include the third semiconductor die 203*a* and the fourth semiconductor die 204*a*.

The third semiconductor die 203*a* may be mounted on the first semiconductor die 201*a* and laterally adjacent (in the x-direction) to the memory bridge die 101. The fourth semiconductor die 204*a* may be mounted on the second semiconductor die 202*a* and laterally adjacent (in the x-direction) to the memory bridge die 101. The third semiconductor die 203*a* may be located on a side of the memory bridge die 101 that is opposite the fourth semiconductor die 204*a*.

Topology-wise, the sixth alternative design in FIG. 10 may be viewed as is a flipped version of the fourth alternative design in FIG. 8. Since this memory bridge die 101 may function as a memory bridge, the memory bridge die 101 may connect to multiple semiconductor dies (e.g., multiple logic dies) directly.

As with the fifth alternative design in FIG. 9, in the sixth alternative design the memory bridge die 101 may have a face-to-face (F2F) arrangement with the first semiconductor die 201*a* and the second semiconductor die 202*a*. Thus, one or more I/O pads 51 on the face side of the memory bridge die 101 may be connected (e.g., by microbumps) to the face side (e.g., active region side) of the first semiconductor die 201*a* and to the face side of the second semiconductor die 202*a*. Thus, the first semiconductor die 201*a* may be connected to the memory bridge die 101 through the I/O pads 51. The second semiconductor die 202*a* may be connected to the memory bridge die 101 through the I/O pads 51. The first semiconductor die 201*a* may also be connected to the second semiconductor die 202*a* through the memory bridge die 101 and the I/O pads 51.

The third semiconductor die 203*a* and the fourth semiconductor die 204*a* may not be directly connected to the memory bridge die 101. However, the third semiconductor die 203*a* may be connected to the memory bridge die 101 through the first semiconductor die 201*a*. The third semiconductor die 203*a* may also be connected to the second semiconductor die 202*a* through the first semiconductor die 201*a* and the memory bridge die 101. The third semiconductor die 203*a* may also be connected to the fourth semiconductor die 204*a* through the first semiconductor die 201*a*, the memory bridge die 101 and the second semiconductor die 202*a*.

The fourth semiconductor die 204*a* may be connected to the memory bridge die 101 through the second semiconductor die 202*a*. The fourth semiconductor die 204*a* may also be connected to the first semiconductor die 201*a* through the second semiconductor die 202*a* and the memory bridge die 101. The fourth semiconductor die 204*a* may also be connected to the third semiconductor die 203*a* through the second semiconductor die 202*a*, the memory bridge die 101 and the first semiconductor die 201*a*.

Figure 11:
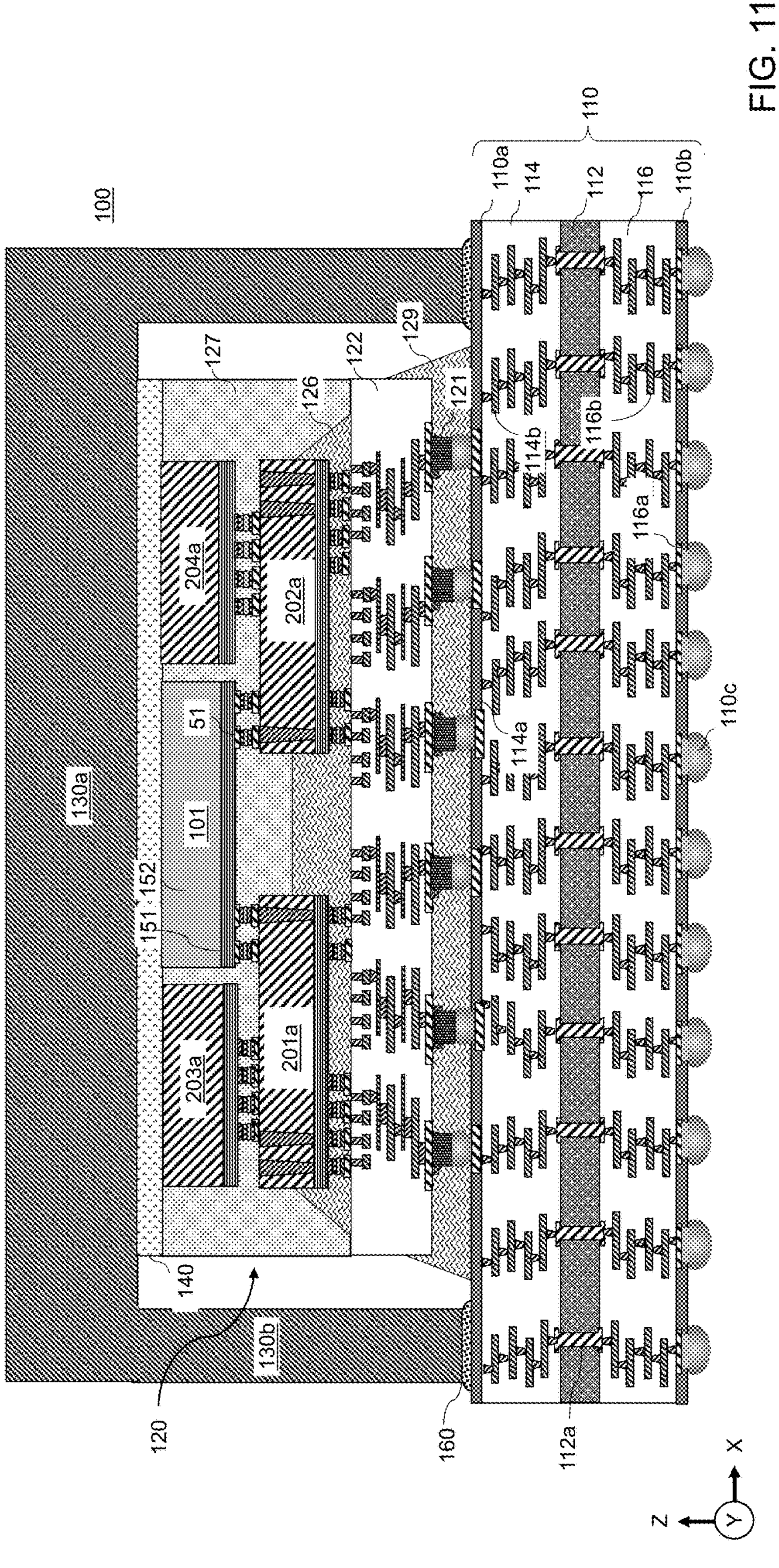
FIG. 11 illustrates a vertical cross-sectional view of the package structure having a seventh alternative design, according to one or more embodiments.

FIG. 11 illustrates a vertical cross-sectional view of the package structure 100 having a seventh alternative design, according to one or more embodiments. As illustrated in FIG. 11, in the seventh alternative design, the interposer module 120 may be similar in structure and function to the interposer module 120 in the sixth alternative design of FIG. 10.

However, in contrast to the sixth alternative design, in the seventh alternative design, each of the first semiconductor die 201*a* and the second semiconductor die 202*a* face toward the interposer 122. That is, the active region of the first semiconductor die 201*a* and the active region of the second semiconductor die 202*a* face toward the interposer 122. Thus, the memory bridge die 101 may have a face-to-back (F2B) arrangement with the first semiconductor die 201*a* and the second semiconductor die 202*a*.

As illustrated in FIG. 11, with the F2B arrangement the seventh alternative design, the I/O pads 51 of the memory bridge die 101 may be connected (e.g., by microbumps) to the active region of the first semiconductor die 201*a* by way of one or more TSVs. The I/O pads 51 of the memory bridge die 101 may be connected (e.g., by microbumps) to the active region of the second semiconductor die 202*a* by way of one or more TSVs.

Referring now to FIGS. 1A-11, a package structure 100 may include a substrate 110, and/or interposer 122, a plurality of dies on the substrate 110 and/or interposer 122, and a memory bridge die 101 including a first input/output structure 51 connected to a first semiconductor die 201*a*-201*d* of the plurality of dies, and a second input/output structure 51 connected to a second semiconductor die 202*a*-202*d* of the plurality of dies, wherein the first semiconductor die 201*a*-201*d* may be connected to the second semiconductor die 202*a*-202*d* through the memory bridge die 101.

In one embodiment, the substrate 110, and/or interposer 122 may include a package substrate 110 and the memory bridge die 101 may be located in the package substrate 110. In one embodiment, the first semiconductor die 201*a*-201*d* and the second semiconductor die 202*a*-202*d* are mounted on an upper surface of the memory bridge die 101 and on an upper surface of the package substrate 110. In one embodiment, the package structure 100 may further include a ball grid array (BGA) 110*c* on a lower surface of the package substrate 110 opposite the upper surface of the package substrate 110, wherein the memory bridge die 101 may include a first through silicon via (TSV) 501 and the package substrate 110 may include a fourth TSV 504 connecting the first TSV 501 to the BGA 110*c*. In one embodiment, the memory bridge die 101 extends longitudinally in a first direction, the first semiconductor die 201*a*-201*d* and the second semiconductor die 202*a*-202*d* are connected to opposite sides of the memory bridge die 101 in a second direction perpendicular to the first direction. In one embodiment, the memory bridge die 101 may include a first memory circuit section 310 extending longitudinally in the first direction and connected to the first semiconductor die 201*a*-201*d*, and a second memory circuit section 320 extending longitudinally in the first direction and connected to the second semiconductor die 202*a*-202*d*. In one embodiment, the first memory circuit section 310 and the second memory circuit section 320 comprise at least one of a memory controller, a memory interface and a physical layer (PHY) circuit. In one embodiment, the memory bridge die 101 further may include a memory array section 330 between the first memory circuit section 310 and the second memory circuit section 320, and extending longitudinally in the first direction. In one embodiment, the memory bridge die 101 further may include a data line 340 connecting the first memory circuit section 310 to the second memory circuit section 320, and the memory array section 330 may include a plurality of memory arrays 330*a*-330*d* connected to the data line 340. In one embodiment, the plurality of dies further may include a third semiconductor die 203*a*-203*d* embedded in the package substrate 110 on a first side of the memory bridge die 101, wherein the first semiconductor die 201*a*-201*d* may be mounted on the third semiconductor die 203*a*-203*d*, and a fourth semiconductor die 204*a*-204*d* embedded in the package substrate 110 on a second side of the memory bridge die 101 opposite the first side of the memory bridge die 101 in the second direction, wherein the second semiconductor die 202*a*-202*d* may be mounted on the fourth semiconductor die 204*a*-204*d*. In one embodiment, the substrate 110, 122 may include an interposer 122, and the memory bridge die 101 may be mounted on the interposer 122, and wherein the plurality of dies further may include a third semiconductor die 203*a*-203*d* mounted on the interposer 122 on a first side of the memory bridge die 101, wherein the first semiconductor die 201*a*-201*d* may be mounted to an upper surface of the memory bridge die 101 and an upper surface of the third semiconductor die 203*a*-203*d*, and a fourth semiconductor die 204*a*-204*d* mounted on the interposer 122 on a second side of the memory bridge die 101 opposite the first side of the memory bridge die 101, wherein the second semiconductor die 202*a*-202*d* may be mounted to the upper surface of the memory bridge die 101 and an upper surface of the fourth semiconductor die 204*a*-204*d*. In one embodiment, the substrate 110, 122 may include an interposer 122, the first semiconductor die 201*a*-201*d* and the second semiconductor die 202*a*-202*d* are mounted on the interposer 122, and the memory bridge die 101 may be mounted on the first semiconductor die 201*a*-201*d* and the second semiconductor die 202*a*-202*d*. In one embodiment, the plurality of dies further may include a third semiconductor die 203*a*-203*d* mounted on the first semiconductor die 201*a*-201*d* adjacent to the memory bridge die 101, and a fourth semiconductor die 204*a*-204*d* mounted on the second semiconductor die 202*a*-202*d* adjacent to the memory bridge die 101. In one embodiment, the memory bridge die 101 may have one of a face-to-face (F2F) configuration or a face-to-back (F2B) configuration with the first semiconductor die 201*a*-201*d* and the second semiconductor die 202*a*-202*d*.

Referring again to FIGS. 1A-11, a method of forming a package structure 100 may include forming an opening O114 in a substrate 110, and/or interposer 122, attaching a memory bridge die 101 including a first input/output structure 51 and a second input/output structure 51 in the opening O114 of the substrate 110, and/or interposer 122, and mounting a plurality of dies on the substrate 110, and/or interposer 122, wherein the plurality of dies includes a first semiconductor die 201*a*-201*d* connected to the first input/output structure 51 of the memory bridge die 101 and a second semiconductor die 202*a*-202*d* connected to the second input/output structure 51 of the memory bridge die 101, and the first semiconductor die 201*a*-201*d* may be connected to the second semiconductor die 202*a*-202*d* through the memory bridge die 101.

In one embodiment, the mounting of the plurality of dies on the substrate 110, and/or interposer 122 may include at least one of hybrid bonding the plurality of dies to the memory bridge die 101 or microbump 128*a* bonding the plurality of dies to the memory bridge die 101. In one embodiment, the substrate 110, 122 may include a package substrate, and the mounting of the plurality of dies may include mounting the first semiconductor die 201*a*-201*d* and the second semiconductor die 202*a*-202*d* on an upper surface of the memory bridge die 101 and on an upper surface of the package substrate 110. In one embodiment, the memory bridge die 101 may include a first through silicon via (TSV) 501 and the package substrate 110 may include a fourth TSV 504 connected to the first TSV 501. In one embodiment, the forming of the opening O114 may include forming the opening O114 to extend longitudinally in a first direction, and wherein the attaching of the memory bridge die 101 may include attaching the memory bridge die 101 so as to extend longitudinally in the first direction, and the first semiconductor die 201*a*-201*d* and the second semiconductor die 202*a*-202*d* are connected to opposite sides of the memory bridge die 101 in a second direction perpendicular to the first direction.

Referring again to FIGS. 1A-11, a package structure 100, may include an interposer 122, a memory bridge die 101 on the interposer 122, and a plurality of dies on the interposer 122 and connected to the memory bridge die 101 and interconnected through the memory bridge die 101. The plurality of dies may include a first semiconductor die 201*a*-201*d* connected to a first input/output structure 51 of the memory bridge die 101, and a second semiconductor die 202*a*-202*d* laterally adjacent to the first semiconductor die 201*a*-201*d* and connected to a second input/output structure 51 of the memory bridge die 101. The package structure 100 may further include a molding material layer on the interposer around the memory bridge die and the plurality of dies. The plurality of dies may further include a third semiconductor die 203*a*-203*d* laterally adjacent to the memory bridge die 101 and connected to the memory bridge die 101 through the first semiconductor die 201*a*-201*d*, and a fourth semiconductor die 204*a*-204*d* laterally adjacent to the memory bridge die 101 on a side of the memory bridge die 101 opposite the third semiconductor die 203*a*-203*d*, and connected to the memory bridge die 101 through the second semiconductor die 202*a*-202*d*.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:

a substrate comprising a package substrate upper dielectric layer;

a plurality of dies on the substrate; and a memory bridge die embedded in the package substrate upper dielectric layer and including a first input/output structure connected to a first semiconductor die of the plurality of dies, and a second input/output structure connected to a second semiconductor die of the plurality of dies, wherein the first semiconductor die is connected to the second semiconductor die through the memory bridge die, wherein:

the substrate comprises a package substrate upper surface layer contacting a top surface of the package substrate upper dielectric layer and contacting sidewalls of the first input/output structure and sidewalls of the second input/output structure;

an interface between the first input/output structure and the memory bridge die is located within a horizontal plane including an interface between the package substrate upper dielectric layer and the package substrate upper surface layer;

the substrate comprises a core that underlies the package substrate upper dielectric layer, through vias that vertically extends through the core, and first metal interconnect structures embedded in the package substrate upper dielectric layer;

a first subset of the through vias contacts first through silicon vias in the memory bridge die;

a second subset of the through vias contacts a subset of the first metal interconnect structures; and a sidewall of the package substrate upper dielectric layer and a sidewall of the core are located within a same vertical plane.

2. The package structure of claim 1, wherein the substrate comprises a package substrate and the memory bridge die is located in the package substrate.

3. The package structure of claim 2, wherein the first semiconductor die and the second semiconductor die are mounted on an upper surface of the memory bridge die and on an upper surface of the package substrate.

4. The package structure of claim 3, further comprising:

a ball grid array (BGA) on a lower surface of the package substrate opposite the upper surface of the package substrate, wherein the memory bridge die comprises a first through silicon via (TSV), and the package substrate comprises an additional TSV connecting the first TSV to the BGA.

5. The package structure of claim 3, wherein the memory bridge die extends longitudinally in a first direction, the first semiconductor die and the second semiconductor die are connected to opposite sides of the memory bridge die in a second direction perpendicular to the first direction.

6. The package structure of claim 5, wherein the memory bridge die comprises a first memory circuit section extending longitudinally in the first direction and connected to the first semiconductor die, and a second memory circuit section extending longitudinally in the first direction and connected to the second semiconductor die.

7. The package structure of claim 6, wherein the first memory circuit section and the second memory circuit section comprise at least one of a memory controller, a memory interface and a physical layer (PHY) circuit.

8. The package structure of claim 7, wherein the memory bridge die further comprises:

a memory array section between the first memory circuit section and the second memory circuit section, and extending longitudinally in the first direction; and a data line connecting the first memory circuit section to the second memory circuit section, and the memory array section comprises a plurality of memory arrays connected to the data line.

9. The package structure of claim 5, wherein the plurality of dies further comprises:

a third semiconductor die embedded in the package substrate on a first side of the memory bridge die, wherein the first semiconductor die is mounted on the third semiconductor die; and a fourth semiconductor die embedded in the package substrate on a second side of the memory bridge die opposite the first side of the memory bridge die in the second direction, wherein the second semiconductor die is mounted on the fourth semiconductor die.

10. The package structure of claim 1, wherein:

the substrate comprises a core composed of epoxy resin or a woven glass laminate;

the substrate further comprises through vias vertically extending through the core; and the memory bridge die comprises bottom bonding pads contacting top surfaces of a subset of the through vias.

11. The package structure of claim 1, wherein the plurality of dies further comprises:

a third semiconductor die embedded in the package substrate upper dielectric layer on a first side of the memory bridge die and connected to the first semiconductor die; and a fourth semiconductor die embedded in the package substrate upper dielectric layer on a second side of the memory bridge die and connected to the second semiconductor die, wherein the package substrate upper surface layer contacts a top surface of the third semiconductor die and contacts a top surface of the fourth semiconductor die.

12. The package structure of claim 1, further comprising:

a first package underfill layer located between the package substrate upper surface layer and the first semiconductor die;

a second package underfill layer located between the package substrate upper surface layer and the second semiconductor die; and a molding material layer laterally surrounding the first semiconductor die, the second semiconductor die, the first package underfill layer, and the second package underfill layer and contacting a top surface of the package substrate upper surface layer.

13. The package structure of claim 1, wherein:

the memory bridge die comprises a bulk semiconductor region and an active region; and the first input/output structure contacts the active region.

14. The package structure of claim 1, wherein:

the substrate further comprises a package substrate lower dielectric layer underlying the core;

the substrate further comprises package substrate lower metal interconnect structures embedded in the package substrate lower dielectric layer;

the substrate further comprises a package substrate lower surface layer contacting a bottom surface of the package substrate lower dielectric layer;

the substrate further comprises a ball grid array on an opposing side of the package substrate lower surface layer as the package substrate lower dielectric layer;

a sidewall of the package substrate lower dielectric layer is located within the same vertical plane as the sidewall of the package substrate upper dielectric layer and the sidewall of the core;

the package substrate upper dielectric layer comprises a polymer material;

the package substrate upper dielectric layer comprises a material selected from the group consisting of polyimide (PI), benzocyclobutene (BCB), and polybenzobisoxazole (PBO);

the package substrate upper dielectric layer includes a plurality of layers;

the package substrate upper dielectric layer includes a build-up film;

the package substrate upper dielectric layer includes one or more package substrate upper bonding pads on a chip-side surface of the package substrate upper dielectric layer;

the package substrate upper dielectric layer includes one or more metal interconnect structures;

each of the one or more metal interconnect structures in the package substrate upper dielectric layer includes a line portion horizontally extending along the package substrate upper dielectric layer and a via portion vertically extending through the package substrate upper dielectric layer; and the one or more metal interconnect structures in the package substrate upper dielectric layer include a metallic material selected from the group consisting of copper, tungsten, aluminum, and alloys thereof.

15. A package structure, comprising:

a package substrate comprising a package substrate upper dielectric layer including an opening therein;

a memory die located in the opening and comprising bottom bonding pads contacting conductive structures in the package substrate, a first input/output structure located on an opposite side of the bottom bonding pads, and a second input/output structure laterally spaced from the first input/output structure;

a first semiconductor die bonded to the first input/output structure of the memory die; and a second semiconductor die bonded to the second input/output structure of the memory die, wherein the first semiconductor die is connected to the second semiconductor die through the memory die, wherein:

the substrate comprises a package substrate upper surface layer contacting a top surface of the package substrate upper dielectric layer and contacting sidewalls of the first input/output structure and sidewalls of the second input/output structure;

an interface between the first input/output structure and the memory die is located within a horizontal plane including an interface between the package substrate upper dielectric layer and the package substrate upper surface layer;

the substrate comprises a core that underlies the package substrate upper dielectric layer, through vias that vertically extends through the core, and first metal interconnect structures embedded in the package substrate upper dielectric layer;

a first subset of the through vias contacts first through silicon vias in the memory bridge die;

a second subset of the through vias contacts a subset of the first metal interconnect structures; and a sidewall of the package substrate upper dielectric layer and a sidewall of the core are located within a same vertical plane.

16. The package structure of claim 15, further comprising:

a third semiconductor die embedded within the packaging substrate and bonded to the first semiconductor die through an additional array of microbumps; and a fourth semiconductor die embedded within the packaging substrate and bonded to the second semiconductor die through a yet additional array of microbumps.

17. The package structure of claim 15, further comprising:

a first underfill material portion laterally surrounding the first semiconductor die and contacting a first segment of a top surface of the packaging substrate;

a second underfill material portion laterally surrounding the second semiconductor die and contacting a second segment of the top surface of the packaging substrate; and a molding material layer laterally surrounding the first underfill material portion and the second underfill material portion and contacting a third segment of the top surface of the packaging substrate.

18. A package structure, comprising:

a package substrate comprising a package substrate upper dielectric layer that includes an opening therein;

a memory die located in the opening and comprising a first input/output structure and a second input/output structure;

a first semiconductor die comprising first microbumps that are bonded to the first input/output structure of the memory die through first solder balls; and a second semiconductor die comprising second microbumps that are bonded to the second input/output structure of the memory die through second solder balls, wherein:

the substrate comprises a package substrate upper surface layer contacting a top surface of the package substrate upper dielectric layer and contacting sidewalls of the first input/output structure and sidewalls of the second input/output structure;

an interface between the first input/output structure and the memory die is located within a horizontal plane including an interface between the package substrate upper dielectric layer and the package substrate upper surface layer;

the substrate comprises a core that underlies the package substrate upper dielectric layer, through vias that vertically extends through the core, and first metal interconnect structures embedded in the package substrate upper dielectric layer;

a first subset of the through vias contacts first through silicon vias in the memory bridge die;

a second subset of the through vias contacts a subset of the first metal interconnect structures; and a sidewall of the package substrate upper dielectric layer and a sidewall of the core are located within a same vertical plane.

19. The package structure of claim 18, wherein:

a first underfill material portion laterally surrounds the first microbumps and contacts a first segment of a top surface of the package substrate upper surface layer; and a second underfill material portion laterally surrounds the second microbumps and contacts a second segment of the top surface of the package substrate upper surface layer.

20. The package structure of claim 18, further comprising a package lid attached to a top surface of the packaging substrate via an adhesive and attached to top surfaces of the first semiconductor die and the second semiconductor die via a thermal interface material layer.

* * * * *